(12) United States Patent
Kanai et al.

(10) Patent No.: US 6,576,946 B1
(45) Date of Patent: Jun. 10, 2003

(54) SEMICONDUCTOR DEVICE COMPRISING CAPACITOR CELLS, BIT LINES, WORD LINES, AND MOS TRANSISTORS IN A MEMORY CELL AREA OVER A SEMICONDUCTOR SUBSTRATE

(75) Inventors: Misuzu Kanai, Higashiyamato (JP); Yuzuru Ohji, Tokyo (JP); Takuya Fukuda, Kodaira (JP); Shinpei Iijima, Akishima (JP); Ryouichi Furukawa, Ome (JP); Yasuhiro Sugawara, Akishima (JP); Hideharu Yahata, Inagi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/356,705

(22) Filed: Jul. 20, 1999

(30) Foreign Application Priority Data

Jul. 29, 1998 (JP) .......................................... 10-213599

(51) Int. Cl.[7] ...................... H01L 27/108; H01L 29/76; H01L 29/94; H01L 31/119
(52) U.S. Cl. ....................................... 257/306; 257/309
(58) Field of Search ............................... 257/295–310; 438/240–254, 396–399

(56) References Cited

U.S. PATENT DOCUMENTS

| | | | | | |
|---|---|---|---|---|---|
| 5,278,091 | A | * | 1/1994 | Fazan et al. | 438/398 |
| 5,340,763 | A | * | 8/1994 | Dennison | 438/398 |
| 5,386,382 | A | * | 1/1995 | Ahn | 257/296 |
| 6,025,624 | A | * | 2/2000 | Figura | 257/309 |
| 6,051,859 | A | * | 4/2000 | Hosotani et al. | 257/306 |

* cited by examiner

*Primary Examiner*—Cuong Quang Nguyen
(74) *Attorney, Agent, or Firm*—Antonelli, Terry, Stout & Kraus, LLP

(57) ABSTRACT

Capacitors are stretched over a plurality of memory cells in the direction of a bit line in order to effectively utilize spaces between adjacent cells. In addition, by creating a cubic structure of each capacitor by adoption of a self-matching technique, the structure can be utilized more effectively. As a result, it is possible to assure a sufficient capacitor capacitance in spite of a limitation imposed by the fabrication technology and obtain an assurance of sufficient space between cells in a shrunk area of a memory cell accompanying high-scale integration and miniaturization of a semiconductor device.

6 Claims, 29 Drawing Sheets

SEMICONDUCTOR DEVICE COMPRISING CAPACITOR CELLS, BIT LINES, WORD LINES, AND MOS TRANSISTORS IN A MEMORY CELL AREA OVER A SEMICONDUCTOR SUBSTRATE

FIELD OF THE INVENTION

In general, the present invention relates to a dynamic random-access memory, such as a DRAM. More particularly, the present invention relates to a semiconductor device having a configuration comprising a DRAM and other semiconductor elements, such as a logic circuit.

BACKGROUND OF THE INVENTION

Miniaturization of a DRAM cell raises a problem in that it is difficult to assure that the capacitance of the capacitor for accumulating an electric charge will be large enough for cell operations due to the fact that the capacitance is reduced by the miniaturization. There have been proposed a variety of techniques to solve this problem. According to one of the techniques, a stack DRAM cell wherein an accumulation electrode is created typically over a word line.

In this memory cell, however, if a accumulator capacitor is created by utilizing the area of the plane portion, the capacitance of the capacitor is reduced as the memory cell is made smaller in size. For this reason, there have been proposed a variety of techniques for increasing the area of the physical shape of the capacitor in the thickness direction of the semiconductor substrate. Nevertheless, it is difficult to implement a DPAM having a capacity of at least 256 Mbit with any of the these techniques.

Concrete examples of the conventional technology are as follows. The capacitor structures shown in FIGS. 1 to 3/are referred to as an STC (Stacked Capacitor), a crown-STC and a FIN-STC, respectively. In each of the structures, one capacitor is provided for each cell. It should be noted that, in FIGS. 1 to 3 reference numeral 0 denotes a semiconductor substrate and reference numeral 1 denotes an insulation film for separating elements from each other. Reference numerals 2 and 3 denote a word line and a bit-line contact plug, respectively. Reference numeral 4 denotes an accumulation-node contact plug and reference numeral 5 denotes a bit line. Reference numerals 7 and 9 denote a capacitor insulation film and a lower electrode, respectively. Reference numeral 14 denotes a capacitor insulation film and reference numeral 15 denotes an upper electrode.

Japanese Patent Laid-open No. Hei 4-83375 discloses a Capacitor structure for high density DRAM cells wherein three fences are created on an area occupied by an accumulation electrode by using first and second protrusions.

In addition, Japanese Patent Laid-open No. Hei 4-212449 discloses an example wherein two capacitors are provided, being stretched over two memory cells in order to secure a large capacitance in the conventional capacitor structure, while assuring a high integration density. For these capacitors, which have a configuration stretched over two memory cells, the capacitors are extended in the direction of the bit line.

SUMMARY OF THE INVENTION

It is thus an object of the present invention to provide a semiconductor device which is capable of assuring a higher capacitance for a memory capacitor while securing a higher density of integration.

The present invention solves a variety problems that are inherent in the conventional technology. One problem involves the difficulty in securing a sufficient capacitance in a capacitor due to a limitation imposed by the fabrication technology to assure sufficient space between capacitors for a shrunk cell area accompanying high-scale integration and miniaturization. Another problem involves an unavoidably reduced yield, which inevitably results in a rising cost of manufacture caused by the fact that the structure of the capacitor is made complicated and the height of the capacitor is increased in order to obtain a sufficient capacitance of the capacitor.

In the case of the memory cell structure described above, as the miniaturization of the memory cell continues, the area occupied by the lower electrode of the capacitor can not help but be reduced. This is because a limitation on the miniaturization by the fabrication technology imposes a limit on the size of the area occupied by the lower electrode. To be more specific, in order to secure a space between capacitors, the cell area can not help reduced. Thus, in order to obtain a sufficient capacitance, the structure of the capacitor is made complicated and the height of the capacitor is increased. An increased number of manufacturing processes and finer processes inevitably lower the product yield and raise the cost of manufacture.

FIG. 4 is a diagram showing the structure of a capacitor disclosed in Japanese Patent Laid-open No. Hei 4-83375. FIG. 4 is a top-view layout of two sets each serving as a unit. One of the sets comprises a first protruding lower electrode 21 and a second protruding lower electrode 22. The other set comprises a first protruding lower electrode 23 and a second protruding lower electrode 24. Three fences are used as the electrode surfaces of the capacitor. The three fences are a fence between the first protruding lower electrode 21 and the second protruding lower electrode 22, a fence between the first protruding lower electrode 23 and the second protruding lower electrode 24 and a fence between the first protruding lower electrode 21 and the first protruding lower electrode 23. In this capacitor structure, however, the first protruding lower electrode 21 and the second protruding lower electrode 22 are created by using a self-matching technique, while the first protruding lower electrodes 23 and 24 are created among themselves by using lithography technology. Thus, as miniaturization progresses, problems are created, such as a decreased yield of-similar products and an increased cost.

A first aspect of the present invention relates particularly to the structure of a stack capacitor cell (STC) and its manufacturing method. That is, a lower electrode of a capacitor for a memory is designed to comprise two portions, namely, a bottom and a wall-shaped body and the lower electrode is mounted in such a way that the longitudinal direction of the wall-shaped body is oriented toward the upper portion of the semiconductor substrate in order to increase the area of the capacitor electrode. In addition, the wall-shaped body and an insulation layer for the capacitor are created by using a so-called self-matching technique, while each layer is created by using the CVD (Chemical Vapor Deposition) method. It is to be noted that the use of a plurality of wall-shaped bodies is just natural and desirable from the capacity-enhancement point of view.

The self-matching technique provided by the present invention is a method whereby, once the position of a protruding body for creating a first wall-shaped body of a capacitor has been determined, members of the capacitor, that is, a second wall-shaped body and the insulation layer, are implemented without a mask process. If the CVD method is used in the creation of these layers, the film thickness of each of the layers can be adjusted with a high degree of freedom. Accordingly, it is possible to create a capacitor structure having a higher capacitance at a density that can be set freely without regard to the area of the memory cell.

According to a second aspect of the present invention, capacitors are created at contiguous locations over a plurality of memory cells which are laid out in the direction of the word line of a semiconductor memory device. In such a contiguous arrangement of capacitors, a capacitor can be created in a space between cells which is not used in the conventional design. As a result, the capacitance of the capacitor can be further increased.

An implementation by a combination of these two aspects of the present invention makes it possible to secure a capacitor having a high capacitance for a memory while assuring a high-density integration. For example, it is possible to implement a semiconductor memory device having a storage capacity of at least 256 Mbit.

In addition, by creating a lower electrode of a capacitor by using a plurality of wall-shaped bodies and by adopting the self-matching technique to produce a wall-shaped body of smaller width and an insulation film of smaller thickness, an upper electrode of the capacitor can be created, which is stretched over a plurality of memory cells laid out in the direction of a word line on the upper side of the stacked-layer body. In the direction of a word line on the upper side of the stacked-layer body, it is easy to obtain a large area. This technique is thus beneficial to creation of a capacitor with a large area.

Next, an outline of various aspects of the present invention will be described.

In the following aspects (1) to (3) of the present invention, a capacitor is particularly created, which is stretched over a plurality of memory cells.

(1) According to a first aspect of the present invention, there is provided a semiconductor device including at least a word line, a bit line and a capacitor having a first electrode and a second electrode over a semiconductor substrate, wherein the capacitor is created over the word and bit lines, while stretched over a plurality of memory cells.

(2) According to a second aspect of the present invention, there is provided a semiconductor device including at least a word line, a bit line and a capacitor having a first electrode and a second electrode over a semiconductor substrate, wherein the capacitor is created over the word and bit lines over the semiconductor substrate, while being extended in the direction of the word line and stretched over a plurality of memory cells.

According to the second aspect of the present invention, the capacitor is extended in the direction of the word line and stretched over a plurality of memory cells to secure a larger area of occupation for the capacitor.

(3) According to a third aspect of the present invention, there is provided a semiconductor device comprising a MOS transistor created on a semiconductor substrate and a capacitor electrically connected to either a drain area or a source area of the MOS transistor wherein the capacitor is extended in the direction of a word line and stretched over a plurality of memory cells.

The semiconductor device according to the third aspect of the present invention is a semiconductor memory device.

Fourth to sixth aspects (4) to (6) of the present invention in particular relate to the structures of lower electrodes of a capacitor.

The fourth to sixth aspects of the present invention particularly relate to the first aspect of the present invention. Members of a capacitor according to the fourth to sixth aspects (4) to (6) of the present invention, such as an insulation film and a wall-shaped body of a first electrode, as well as members used in processes of manufacturing the capacitor members, are fabricated by using a CVD method so that the thickness and the spacing of each member can be adjusted. Thus, by adopting the so-called self-matching technique, at least, these members can be created to produce fine capacitor cells at a pitch equal to half a minimum fabrication dimension during the fabrication of the semiconductor device.

(4) According to the fourth aspect of the present invention, there is provided a semiconductor device comprising a MOS transistor created on a semiconductor substrate, word and bit lines over the semiconductor substrate and a capacitor which has a first electrode placed on a semiconductor-substrate side and which is electrically connected to either a drain area or a source area of the MOS transistor, and a second electrode placed on a side opposite to the semiconductor-substrate side, wherein:

the capacitor is created over the word and bit lines;

the first electrode of the capacitor has a bottom and a plurality of wall-shaped bodies electrically connected to the bottom; and the second electrode of the capacitor is placed over the first electrode, being separated from the first electrode by an insulation film.

(5) According to the fifth aspect of the present invention, there is provided a semiconductor device comprising a MOS transistor created on a semiconductor substrate, word and bit lines over the semiconductor substrate and a capacitor which has a first electrode placed on a semiconductor-substrate side and which is electrically connected to either a drain area or a source area of the MOS transistor, and a second electrode placed on a side opposite to the semiconductor-substrate side, wherein:

the capacitor is created over the word and bit lines;

the first electrode of the capacitor has a bottom and a plurality of wall-shaped bodies electrically connected to the bottom;

the second electrode of the capacitor is placed over the first electrode, being separated from the first electrode by an insulation film; and the capacitor is stretched over a plurality of memory cells.

According to the fifth aspect of the present invention, the capacitor is stretched over a plurality of memory cells so that an area occupied by the capacitor can be increased.

(6) According to the sixth aspect of the present invention, there is provided a semiconductor device comprising a MOS transistor created on a semiconductor substrate, word and bit lines over the semiconductor substrate and a capacitor which has a first electrode placed on a semiconductor-substrate side and which is electrically connected to either a drain area or a source area of the MOS transistor, and a second electrode placed on a side opposite to the semiconductor-substrate side, wherein:

the capacitor is created over the word and bit lines;

the first electrode of the capacitor has a bottom and a plurality of wall-shaped bodies electrically connected to the bottom;

the second electrode of the capacitor is placed over the first electrode, being separated from the first electrode by an insulation film; and the capacitor is extended in a direction of the word line and stretched over a plurality of memory cells.

According to the sixth aspect of the present invention, the capacitor is extended in a direction of the word line and is stretched over a plurality of memory cells so that an area occupied by the capacitor can be further increased.

(7) According to a seventh aspect of the present invention, there is provided a semiconductor device comprising semiconductor device elements and a semiconductor memory element which are created over a semiconductor substrate wherein the semiconductor memory element is a storage element having the capacitor according to any one of the first to sixth aspects of the present invention and the semiconductor device elements each have a function different from that of the semiconductor memory element. Examples of the semiconductor device elements each having a function different from that of the semiconductor memory element are a logic circuit and a microcomputer. It is needless to say that the semiconductor memory element having the capacitor provided by the present invention can be combined with other semiconductor devices.

Eighth to tenth aspects (8) to (10) of the present invention relate to desirable conditions of a method of locating the capacitor and a method of forming the lower electrode.

(8) According to the eighth aspect of the present invention, there is provided a semiconductor device wherein a capacitor is stretched over $2^n$ (the nth power of 2) memory cells laid out at a contiguous location where n is a natural number.

(9) According to the ninth aspect of the present invention, there is provided a semiconductor device wherein the relation $x<d<(x+Y)$ holds true where the symbol d denotes a gap between bottoms of two adjacent capacitors, the symbol x denotes the thickness of the wall-shaped body and the symbol y denotes a gap between two adjacent wall-shaped bodies.

(10) According to the tenth aspect of the present invention, there is provided a semiconductor device as in any one of the fourth, fifth and sixth aspects of the present invention wherein the relation $z=n(x+y)$ holds true where the symbol n is a natural number, the symbol z denotes the length of the capacitor cell in a direction, the symbol x denotes the thickness of the wall-shaped body and the symbol y denotes a gap between two adjacent wall-shaped bodies.

An eleventh aspect of the present invention relates to an embodiment implementing a semiconductor memory device using a memory mat.

(11) According to the eleventh aspect of the present invention, there is provided a semiconductor device including a memory mat having a plurality of units each comprising a plurality of memory cells and a capacitor stretched over the memory cells.

Twelfth to fourteenth aspects (12) to (14) of the present invention relate to connections of the capacitor to the semiconductor-substrate side and particularly to the MOS-transistor side. The twelfth to fourteenth aspects (12) to (14) of the present invention are described in general terms as follows.

In the first place, in a semiconductor device according to any one of the aspects of the present invention, a unit comprises a plurality of memory cells and a capacitor stretched over the memory cells and the contact position of each storage node of the capacitor in each unit is shifted in the direction of its respective bit line.

In the second place, in a semiconductor device according to any one of the aspects of the present invention, a unit comprises a plurality of memory cells and a capacitor stretched over the memory cells, the contact position of each storage node of the capacitor in each unit is shifted in the direction of its respective bit line and at least one of storage-node contacts is created right above a contact drawn from a source or drain area.

However, the storage-node contact may be created at a position other than a location right above a contact drawn from a source or drain area. To put it completely, in the third place, semiconductor device according to any one of the aspects in a of the present invention, a unit comprises a plurality of memory cells and a capacitor stretched over the memory cells, the contact position of each storage node of the capacitor in each unit is shifted in the direction of its respective bit line and at least one of the storage-node contacts is created at a position other than a location right above a contact drawn from a source or drain area.

Representative embodiments according to the aspects of the invention will be described briefly.

(12) According to the twelfth aspect of the present invention, there is provided a semiconductor device including a MOS transistor created on a semiconductor substrate and a capacitor electrically connected to either a source area or a drain area of the MOS transistor wherein:

the capacitor is connected to either the source area or the drain area of the MOS transistor through a conductive layer; and a planar-coordinate position of a junction between the source area or the drain area of the MOS transistor and the conductive layer is different from a planar-coordinate position of a junction between the capacitor and the conductive layer.

(13) According to the thirteenth aspect of the present invention, there is provided a semiconductor device as in any one of the aspects (1), (2), (3), (5) and (6) of the present invention with the semiconductor device including a MOS transistor created on a semiconductor substrate and a capacitor electrically connected to either a source area or a drain area of the MOS transistor wherein:

the capacitor is connected to either the source area or the drain area of the MOS transistor through a conductive layer; and a planar-coordinate position of a junction between the capacitor and the conductive layer is shifted in the direction of the bit line from a planar-coordinate position of a junction to the source area or the drain area of the MOS transistor and the conductive layer.

(14) According to the fourteenth aspect of the present invention, there is provided a semiconductor device including a MOS transistor created on a semiconductor substrate and a capacitor electrically connected to either a source area or a drain area of the MOS transistor wherein:

the capacitor is connected to either the source area or the drain area of the MOS transistor through a conductive layer; and a planar-coordinate position of a junction between the source area or the drain area of the MOS transistor and the conductive layer virtually coincides with a planar-coordinate position of a junction between to the capacitor and the conductive layer.

Next, methods to fabricate the semiconductor devices provided by the present invention will be described briefly.

(15) According to a fifteenth aspect of the present invention, there is provided a method of fabricating a semiconductor device comprising the steps of:

carrying out a process to prepare a semiconductor substrate and to create at least a semiconductor element having source and drain areas of a MOS transistor on the semiconductor Substrate and a bit line, a bit-line contact and a storage-node contact on the semiconductor element;

carrying out a process to create a bottom surface of a first electrode of a capacitor of the semiconductor device by separation using an insulation layer; and carrying out a process to provide gaps among a plurality of wall-shaped conductive layers connected to the bottom surface of the first electrode of the capacitor by creation and removal of predetermined layers using a CVD (Chemical Vapor Deposition) technique.

(16) According to a sixteenth aspect of the present invention, there is provided a method of fabricating a semiconductor device comprising at least the steps of:

(a) carrying out a process to prepare a semiconductor substrate and to create at least a semiconductor element having source and drain areas of a MOS transistor on the semiconductor substrate and a bit line, a bit-line contact and a storage-node contact over the semiconductor element;

(b) carrying out a process to create a bottom of a first electrode of a capacitor of the semiconductor device by separation using an insulation layer;

(c) carrying out a process to create a first insulation layer having a comb-tooth shape over the semiconductor substrate prepared in this way with the layer having a thickness large enough for inserting at least an insulation layer constituting a portion of a plurality of wall-shaped bodies of a capacitor and a conductive layer constituting a part of a plurality of wall-shaped bodies of the capacitor;

(d) carrying out a process to create a plurality of first wall-shaped body conductive layers of the capacitor and a plurality of second wall-shaped body conductive layers of the capacitor separated from each other by a predetermined gap with the position of the first insulation layer with a comb-tooth shape taken as a base;

(e) carrying out a process to create an insulation layer on the surfaces of the first wall-shaped body conductive layers, the second wall-shaped body conductive layers and the bottom of the first electrode of the capacitor created in this way; and (f) carrying out a process to create a second electrode of the capacitor.

In the fabrication method described above, if the position of the first insulation layer with a comb-tooth shape is determined by using a photo mask, the other members of the capacitor can be created and fabricated by adoption of the so-called self-matching technique which does not use a photo mask.

(17) According to a seventeenth aspect of the present invention, there is provided a method of fabricating a semiconductor device as in the sixteenth aspect of the present invention wherein, at the step of carrying out a process to create a plurality of first wall-shaped body conductive layers of the capacitor and a plurality of second wall-shaped body conductive layers of the capacitor separated from each other by a predetermined gap, the layers are created by adopting a CVD technique.

DESCRIPTION OF THE PREFERRED EMBODIMENTS

Embodiments of the present invention are exemplified by actual fabrication processes which are explained below. First of all, the steps of the fabrication processes will be explained briefly. It should be noted that reference notations (a), (b) and so on appended to the fabrication steps in the following description are the same as the reference notations used in the explanation of the sixteenth aspect of the present invention. In the following description, the processes will be explained in more detail.

Figure 5:
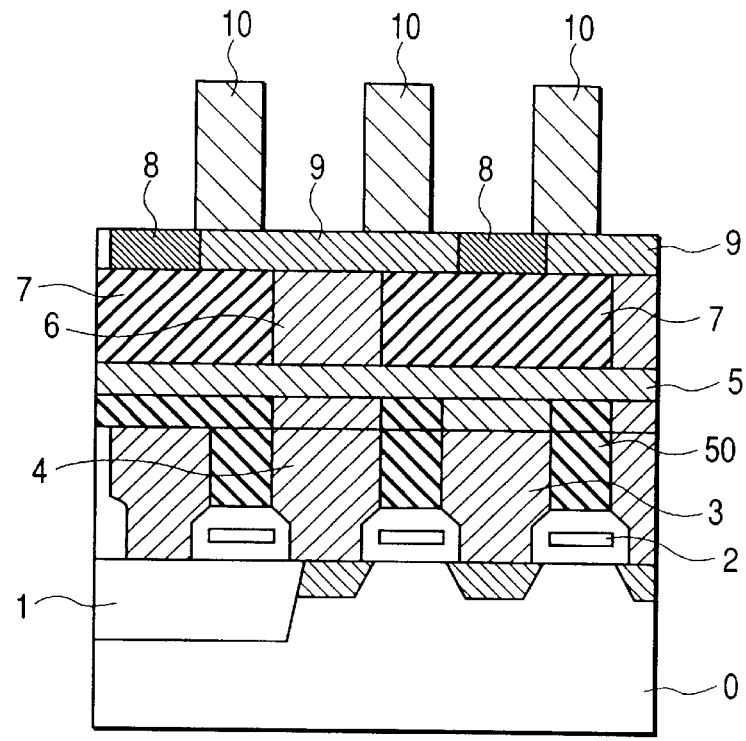
FIG. 5 is a model cross-sectional diagram showing a step in a basic process of a self-matching technique provided by the present invention.
Figure 6:
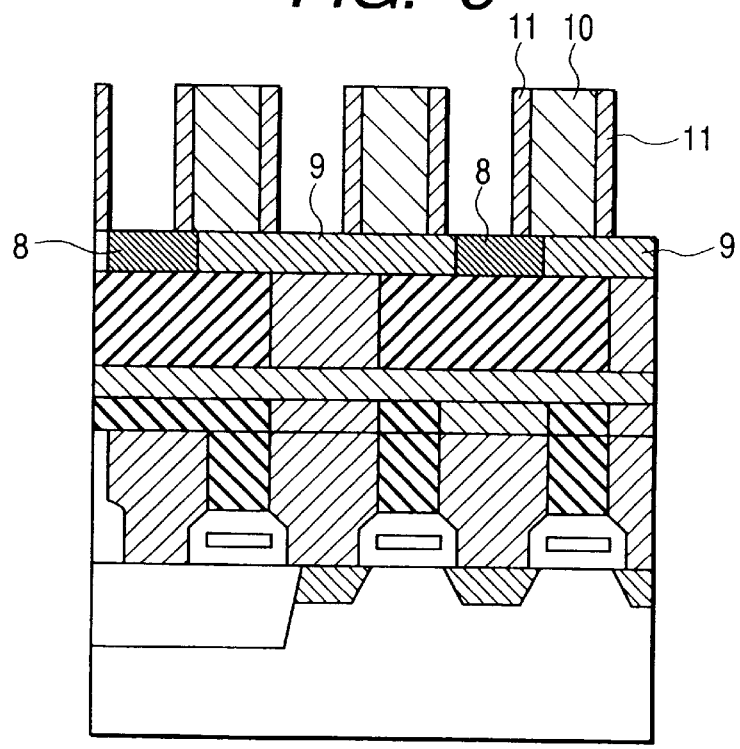
FIG. 6 is a model cross-sectional diagram showing a further step in the basic process of a self-matching technique provided by the present invention.
Figure 7:
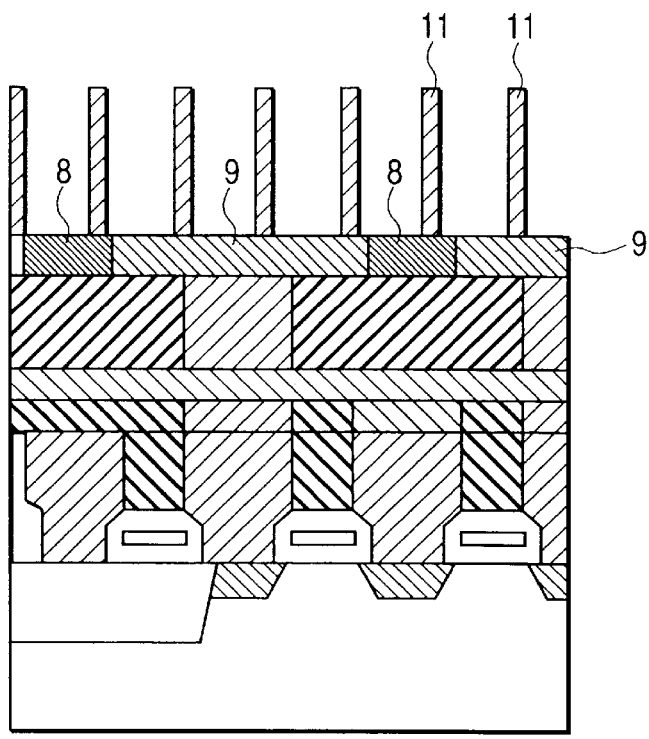
FIG. 7 is a model cross-sectional diagram showing a further step in the basic process of a self-matching technique provided by the present invention.
Figure 8:
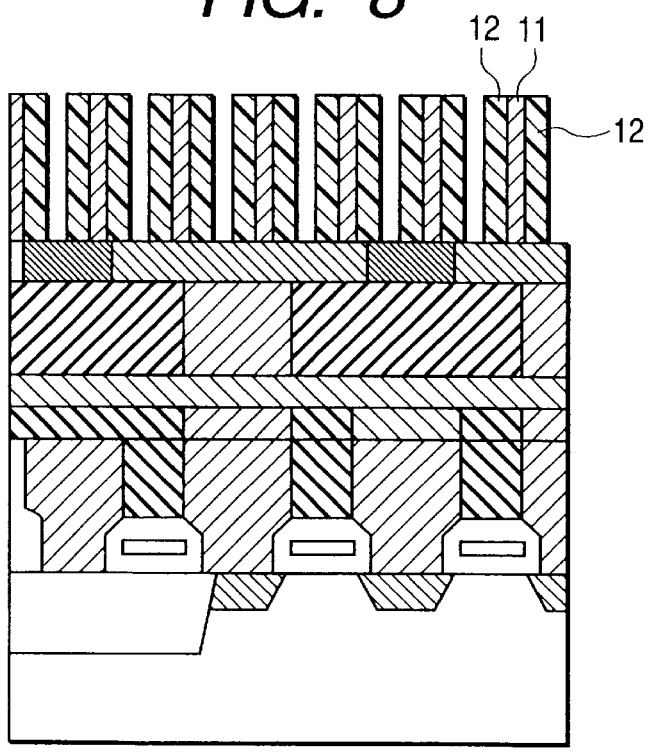
FIG. 8 is a model cross-sectional diagram showing a further step in the basic process of a self-matching technique provided by the present invention.

It should be noted that FIGS. 5 to 12 are each a cross-sectional diagram showing a step in the order of process only for portions related to a self-matching technique provided by the present invention in order to make the self-matching technique easy to understand. In FIGS. 5 to 12 reference numeral 0 denotes a semiconductor substrate and reference numeral 1 denotes an insulation film for separating elements from each other. Reference numerals 2 and 3 denote a word line and a bit line contact plug, respectively. Reference numeral 4 denotes an accumulation-node contact plug and reference numeral 5 denotes a bit line. Reference numeral 6 denotes a storage-node contact. Reference numerals 7 and 9 denote an insulation film and a lower electrode, respectively. Reference numerals 10 and 12 each denote an insulation layer, whereas reference numerals 11 and 13 denote wall-shaped bodies constituting the lower electrode of the capacitor. Reference numeral 14 denotes a capacitor insulation film and reference numeral 15 denotes an upper electrode. In FIGS. 6 to 12, only portions directly related to the self-matching technique are denoted by reference numerals. Portions hatched in FIGS. 6 to 12 in the same way as portions shown in FIG. 5 are identical with the corresponding portions shown in FIG. 5.

Figure 12:
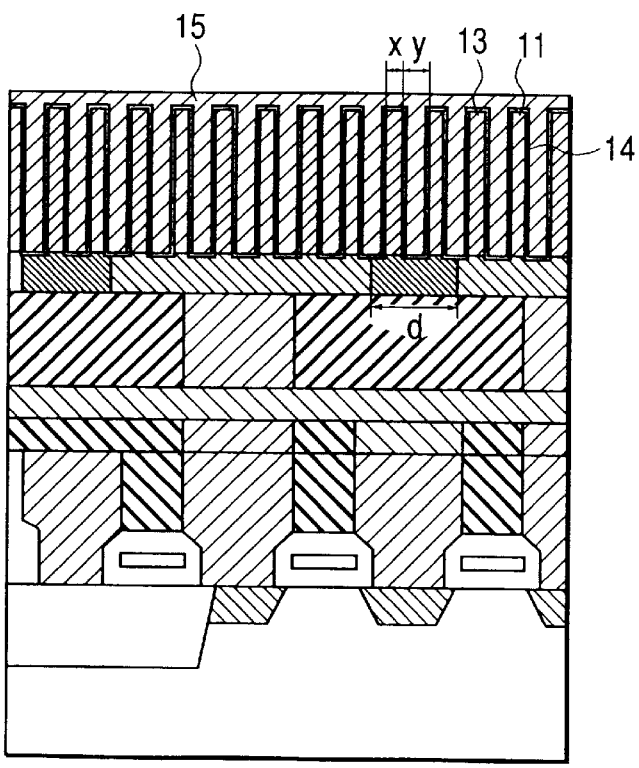
FIG. 12 is a model cross-sectional diagram showing a further step in the basic matching technique provided by the present process of a self invention.

FIGS. 13 to 33 include typical cross-sectional and typical top-view diagrams each showing an order of processes to fabricate a capacitor employed in a memory mat of a semiconductor device provided by the present invention. It should be noted that some portions shown in FIGS. 13 to 33 are also shown in FIGS. 5 and 12. By referring to FIGS. 5 to 12 for main elements, FIGS. 13 to 33 can be understood with ease.

Figure 9:
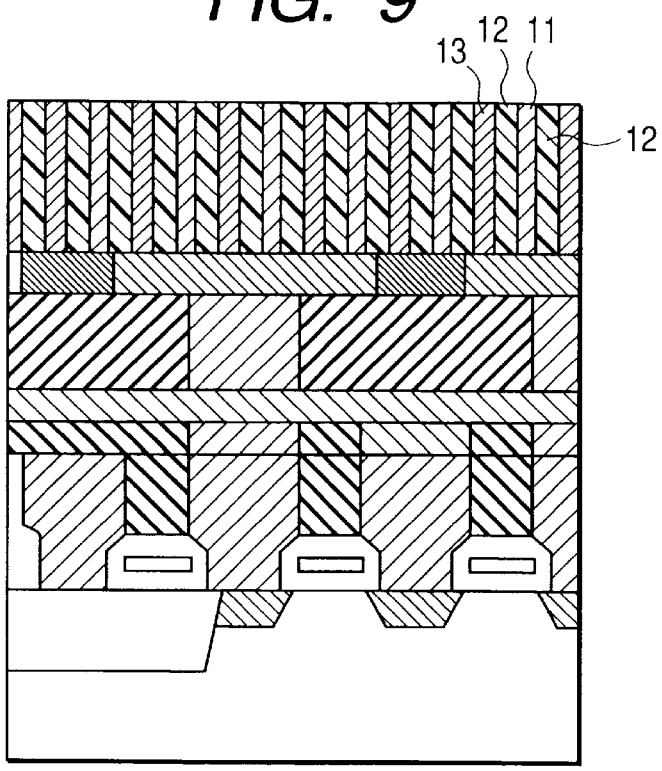
FIG. 9 is a model cross-sectional diagram showing a further step in the basic process of a self-matching technique provided by the present invention.
Figure 10:
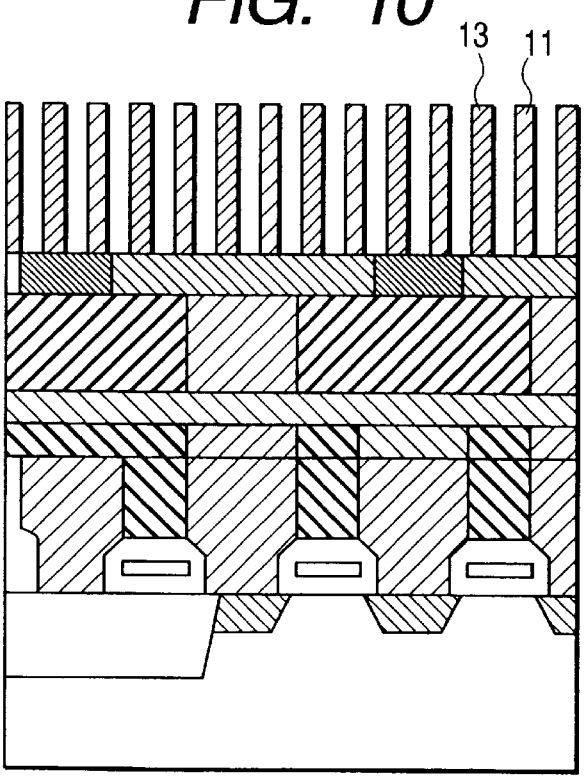
FIG. 10 is a model cross-sectional diagram showing a further step in the basic process of a self-matching technique provided by the present invention.
Figure 11:
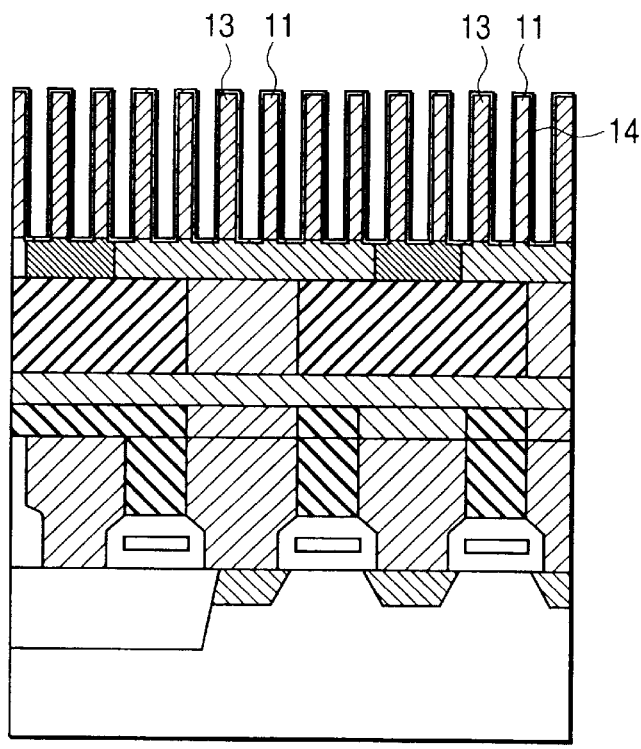
FIG. 11 is a model cross-sectional diagram showing a further step in the basic process of a self-matching technique provided by the present invention.

Basic Processes of the Self-Matching Technique
- (a) A process of preparing a semiconductor substrate and creating at least a semiconductor element having source and drain areas of a MOS transistor on the semiconductor substrate and a bit line 5, a bit-line contact 3 and a storage-node contact 6 on the semiconductor element,
- (b) A process of creating bottom conductive layers 9 separated by insulation layers 8 of a first electrode of a capacitor of the semiconductor device. That is, the formation of the bottom conductive layer 9 comprises the steps of:
  - (b-1) creating a plurality of insulation layers 8 for separating the bottom of the first electrode of the capacitor of the semiconductor device;
  - (b-2) creating the conductive layer 9 to serve as the bottom of the first electrode of the capacitor of the semiconductor device by filling up gaps among the insulation layers 8.
- (c) A process of creating a first insulation layer 10 with a comb-tooth shape on the semiconductor substrate prepared in this way with the insulation layer 10 having a thickness large enough for inserting at least an insulation layer for the capacitor—and a conductive layer constituting a wall-shaped body of the capacitor. (Refer to FIG. 5).
- (d) A process of creating a plurality of first wall-shaped body conductive layers 11 of the capacitor and a plurality of second wall-shaped body conductive layers 12 of the capacitor separated from each other by a predetermined gap with the position of the first insulation layer 10 with a comb-tooth shape taken as a base. The conductive layers 11 and 12 sandwiching the predetermined gap are created as follows:
  - (d-1) A plurality of first wall-shaped body conductive layers 11 are created on both side surfaces of the first insulation layer 10 with a comb-tooth shape to constitute walls of the capacitor. A gap between any 2 adjacent first conductive layers is large enough for inserting at least an insulation layer for the capacitor and a second conductive layer constituting a portion of a wall-shaped body of the capacitor. (Refer to FIG. 6).
  - (d-2) The insulation layer 10 is removed, (Refer to FIG. 7).
  - (d-3) A plurality of second insulation layers 12 each having a comb-tooth shape are created in gaps among the first wall-shaped conductive layers 11 in such a way that a gap between any two adjacent second insulation layers 12 each having a comb-tooth shape is large enough for inserting at least the second wall-shaped conductive layer 13. (Refer to FIG. 8).
  - (d-4) The second wall-shaped conductive layer 13 constituting a portion of the wall-shaped body of the capacitor is inserted into a gap between the second insulation layers 12 each having a comb-tooth shape. Refer to FIG. 9.
  - (d-5) The second insulation layers 12 each having a comb-tooth shape are removed. (Refer to FIG. 10). In this way, a predetermined gap is formed between a plurality of second wall-shaped body conductive layers 12 and a plurality of first wall-shaped body conductive layers 11 constituting a wall-shaped body of the capacitor as shown in FIG. 10.
- (e) An insulation layer 14 is created for formation of a capacitance of the capacitor on the surfaces of the second wall-shaped body conductive layers 12, the first wall-shaped body conductive layers 11 and bottom 9 of the first electrode of the capacitor created in this way. (Refer to FIG. 11). It should be noted that the insulation layer 14 is shown merely by a thick line due to a limitation on the size of the diagram.
- (f) A second electrode 15 of the capacitor is created. (Refer to FIG. 12).

Examples of Fabrication Methods

Examples of fabrication methods will be explained in concrete terms by referring to FIGS. 13 to 33. It should be noted that, since some portions shown in FIGS. 13 to 33 are also shown in FIGS. 5 and 12, by referring to FIGS. 5 to 12 for main elements if necessary, FIGS. 13 to 33 can be understood with ease. In addition, reference notations (a), (b) and so on appended to the fabrication processes in the following description are the same as the reference notations used in the explanation of the sixteenth aspect of the present invention and the basic processes of the self-matching technique.

- (a) After an element separation area 1 is created on a silicon substrate 0 by using a generally known method, a plurality of MOS transistors are created in a predetermined area enclosed by the element separation area 1. Normally, the element separation area 1 is a field oxide film. Then, an insulation film layer 50 is created on the semiconductor substrate 0 prepared in this way. On the insulation film layer 50, predetermined bit-line contacts 3 and storage-node (SN) contacts 4 are created.

Figure 13:
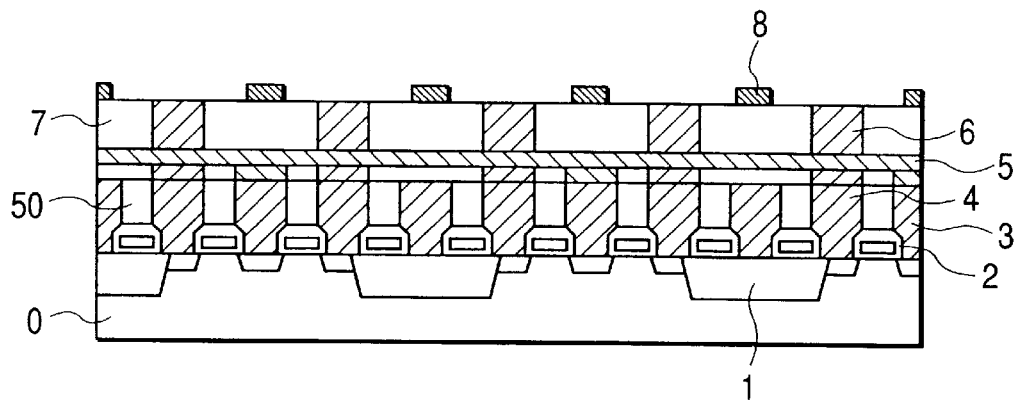
FIG. 13 is a model cross-sectional diagram showing a step in the process of fabricating a capacitor employed in a memory mat of a semiconductor device provided by the present invention.
Figure 14:
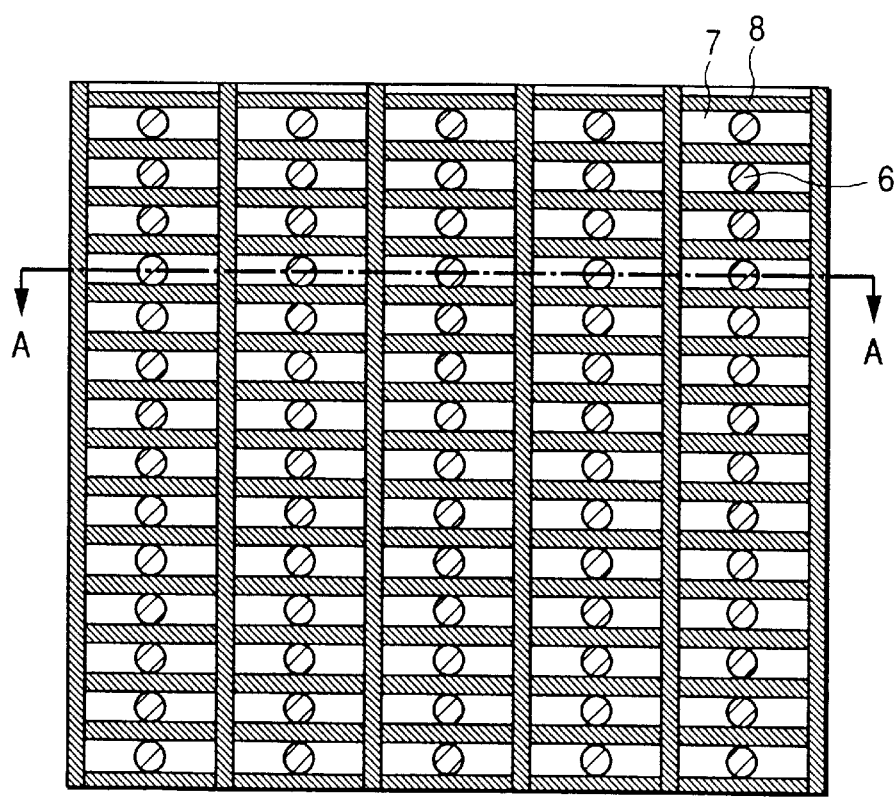
FIG. 14 is a top-view diagram showing the process of fabricating a capacitor employed in a memory mat of a semiconductor device shown in FIG. 13.
Figure 15:
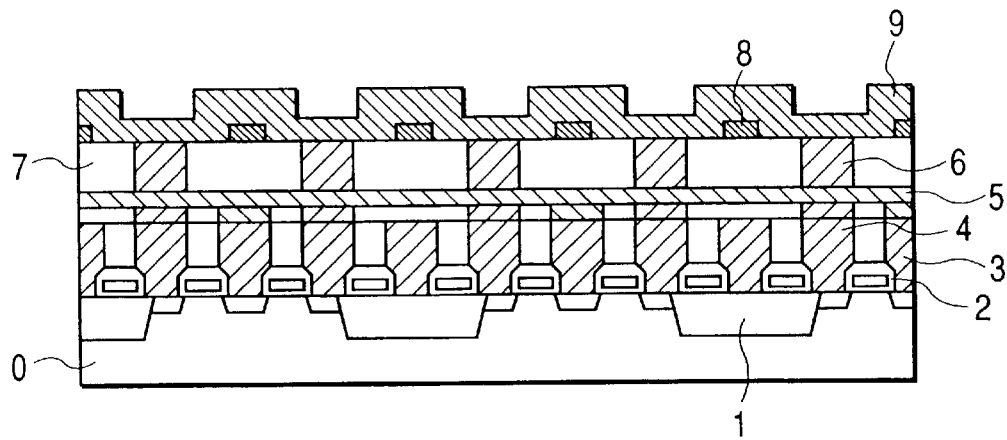
FIG. 15 is a model cross-sectional diagram showing a further step in the process of fabricating a capacitor employed in a memory mat of a semiconductor device provided by the present invention.
Figure 16:
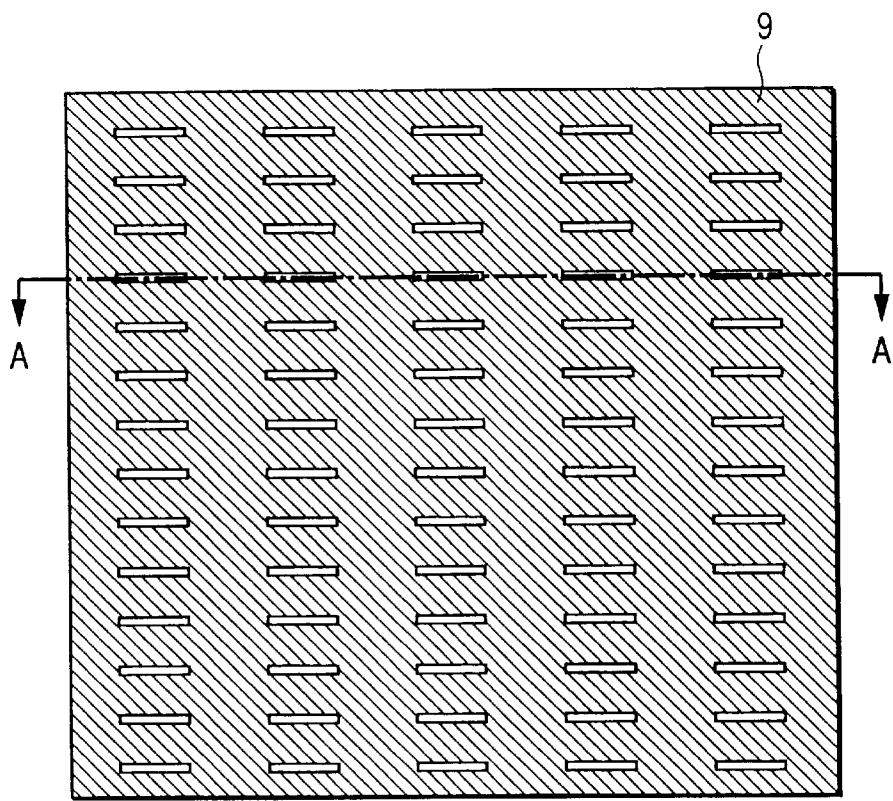
FIG. 16 is a top-view diagram showing the process of fabricating a capacitor employed in a memory mat of a semiconductor device provided by the present invention shown in FIG. 15.

As shown in FIG. 13, after a bit line 5 is stretched in the column direction of the laid out MOS transistors, an insulation film layer 7 is created on the bit line 5. Furthermore, second storage-node (SN) contacts 6 are created on the insulation film layer 7. It is needless to say that the first storage-node (SN) contacts 4 and the second storage-node (SN) contacts 6 are connected to each other.
- (b)
  - (b-1) Then, a desired $Si_3N_4$ layer 8 is created as shown in FIG. 13. The $Si_3N_4$ layer 8 is then subjected to the commonly known dry-etching and wet-etching processes in order to make a pattern width of a residual $Si_3N_4$ layer 8 form a gap in a direction parallel to a semiconductor-substrate surface of the bottom of a lower electrode of a capacitor. FIG. 14 is a diagram showing a top view of what is shown in FIG. 13. FIG. 13 is a diagram showing a cross section indicated by a line AA shown in FIG. 14. Unless otherwise specified, relations of cross sections and top views of states of processes shown in the following figures are the same as the relation between the top view and the cross section of the state of the process shown in FIGS. 14 and 13 respectively. A portion shown as a circle in FIG. 14 is the storage-node contact 6.
  - (b-2) A poly-Si (poly-silicon) layer 9 is created to cover fine lines of the $Si_3N_4$ layer 8 with a predetermined shape on the semiconductor substrate 0 prepared in this way as shown in FIG. 15. FIG. 15 is a cross-sectional diagram showing the state of the process whereas FIG. 16 is a top-view diagram showing the same state of the process. The position of the cross section shown in FIG. 15 in the process shown in FIG. 16 is indicated in the same way as the position of the cross section shown in FIG. 13 in the state shown in FIG. 14 described earlier. It should be noted that protrusions each developed for an $Si_3N_4$ fine line 8 are shown in FIG. 16 as small long rectangles which are laid out to form a matrix.

Figure 17:
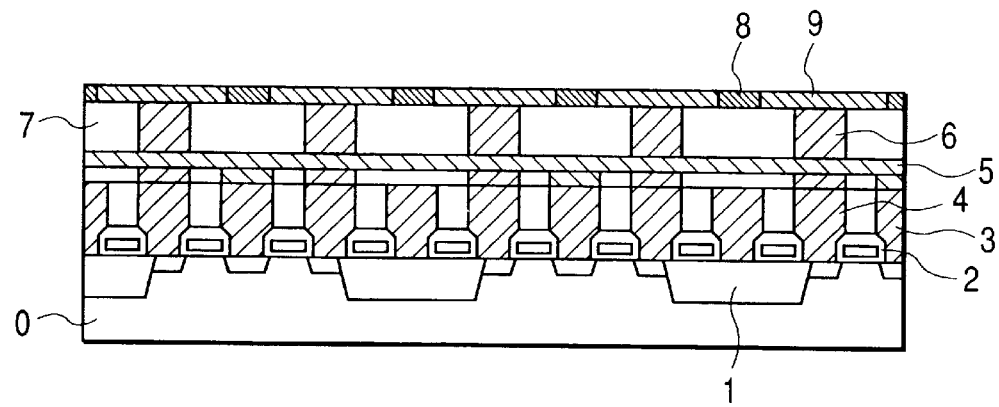
FIG. 17 is a model cross-sectional diagram showing a further step in the process of fabricating a capacitor employed in a memory mat of a semiconductor device provided by the present invention.
Figure 18:
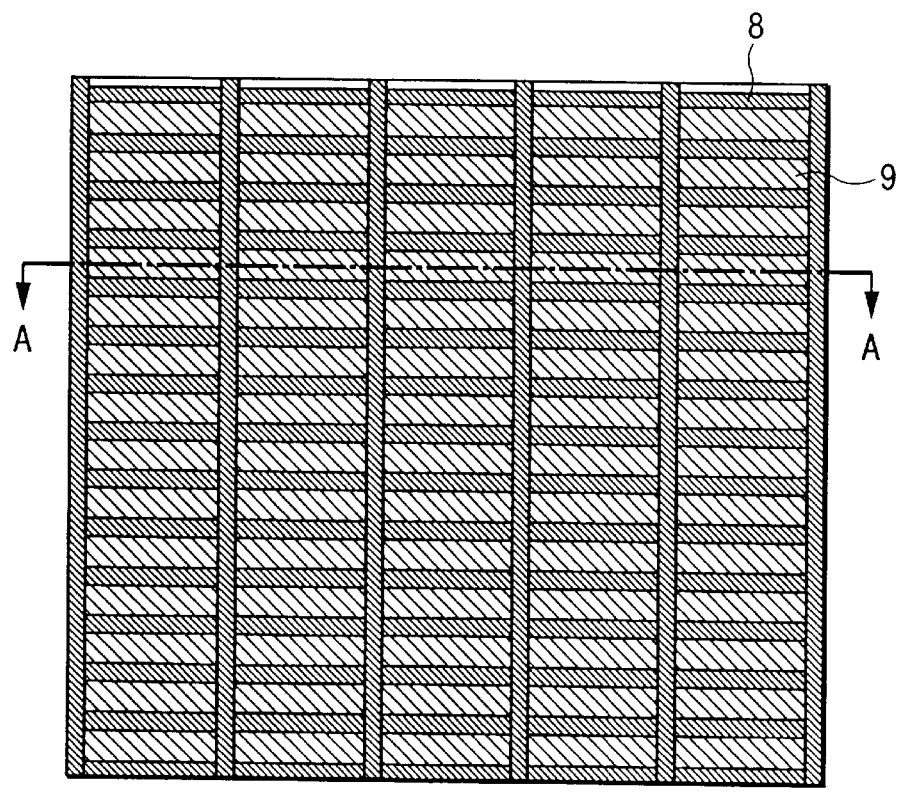
FIG. 18 is a top-view diagram showing the process of fabricating a capacitor employed in a memory mat of a semiconductor device provided by the present invention shown in FIG. 17.

The poly-Si layer 9 is etched back so that the surface thereof is flattened to a plane at about the same level as the $Si_3N_4$ layer 8. In this way, an island-like pattern 9 of poly-Si is created, being delimited by fine lines of the $Si_3N_4$ layer 8 as shown in FIG. 17. FIG. 18 is a top-view diagram associated with the cross-sectional diagram of FIG. 17. In FIG. 18, a rectangular pattern 9 of poly-Si delimited by fine lines 8 of $Si_3N_4$ is shown. The rectangular pattern 9 of poly-Si serves as the bottom surface (the base) of a storage-node electrode. With the base of the storage-node electrode determined in this way, the reader well-understands the meaning of the phrase, "make a pattern width of a residual $Si_3N_4$ layer 8 form a gap in a direction parallel to a semiconductor-substrate surface of the bottom of a lower electrode of a capacitor", in an earlier description of FIG. 13.

Figure 19:
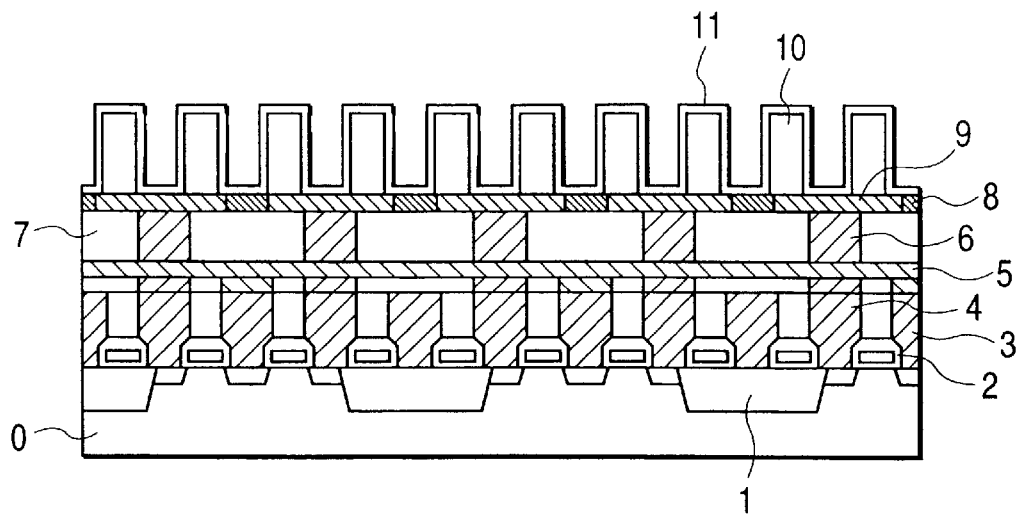
FIG. 19 is a model cross-sectional diagram showing a further step in the process of fabricating a capacitor employed in a memory mat of a semiconductor device provided by the present invention.
Figure 20:
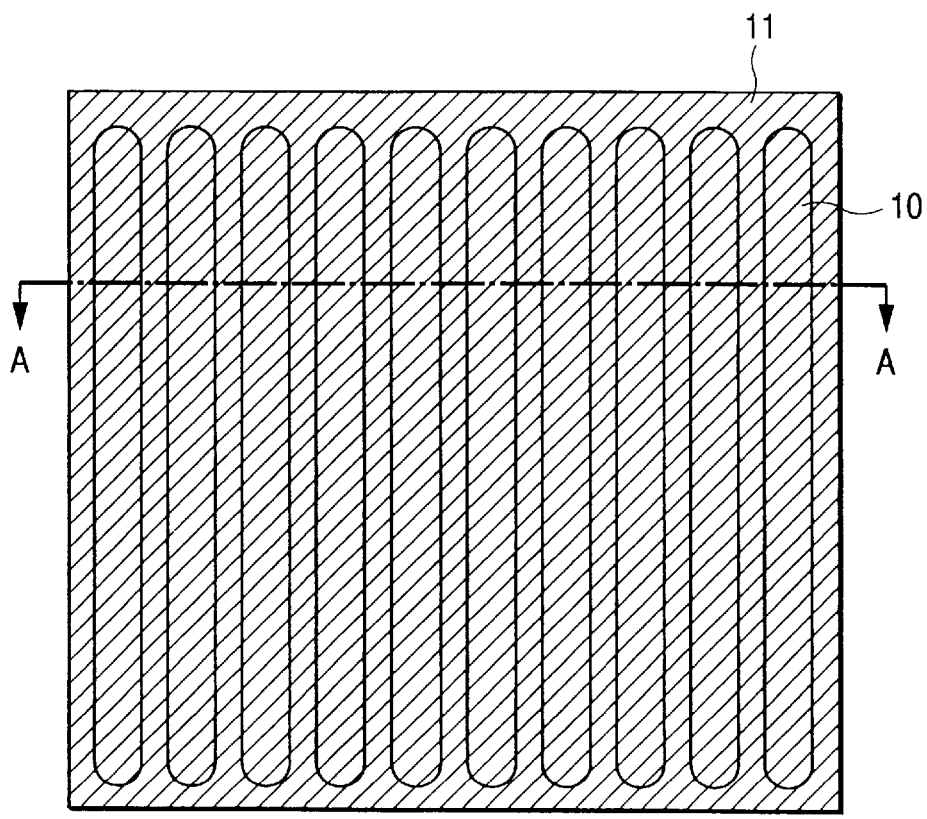
FIG. 20 is a top-view diagram showing the process of fabricating a capacitor employed in a memory mat of a semiconductor device provided by the present invention shown in FIG. 19.

(c) Next, an $SiO_2$ layer 10 is created by adopting the CVD method at about the same height as the capacitor on the surface of the semiconductor substrate prepared in this way. Grooves are further formed on the $SiO_2$ layer 10 at a predetermined pitch. In this state, a phosphor-doped poly-Si conformal layer 11 is created by adopting the CVD method as shown in FIG. 19. FIG. 20 is a top-view diagram showing this state. The surface is the phosphor-doped poly-Si layer 11. However, a comb pattern of the $SiO_2$ layer 10 is shown in the figure.

As will be understood from the subsequent processes, the positions of the grooves formed at a predetermined pitch and fabrication precision determine the positions of a plurality of wall surfaces constituting a lower electrode of the capacitor. Thus, once an etching process using photoresist is carried out on the $SiO_2$ layer, in the subsequent process to create the phosphor-doped poly-Si layers 11 and 13 to serve as the lower electrode or an $SiO_2$ layer for determining a distance from the layers 11 and 13, the CVD method is adopted. Thus, by adopting the self-matching technique, it is possible to obtain fine capacitor cells at a pitch equal to half a minimum fabrication dimension normally adopted in the semiconductor field.

It should be noted that a later description will explain actually desirable conditions as to how a gap at the bottom of the capacitor or adjustment of the bottom relative to the vertical portion is optimized.

(d)
(d-1) Subsequently, the phosphor-doped poly-Si layer 11 in the state shown in FIG. 20 is etched back to remove the phosphor-doped poly-Si layer 11 on the surface of the $SiO_2$ layer 10 as shown in a cross-sectional diagram of FIG. 21 and the top-view diagram of FIG. 22. In this way, a plurality of first wall-shaped conductive layers 11 (phosphor-doped poly-Si layers 11) constituting a wall-shaped body of the capacitor are created on both sides of the insulation layer 10 with a comb-tooth shape (the $SiO_2$ layer 10).

(d-2) The insulation layer 10 (the $SiO_2$ layer 10) is removed. That is, the $SiO_2$ layer 10 sandwiched by the phosphor-doped poly-Si layers 11 which are created into a wall shape is removed selectively by using the wet etching technique. As a result, a comb pattern of the phosphor-doped poly-Si layer 11 remains as a residuum in this state. FIG. 22 shows the phosphor-doped poly-Si layer 11 as an ellipse. It should be noted that the semicircular areas at the ends of the ellipse are unnecessary portions or unnecessary members of the final device. In this process, however, the semicircular areas are useful for holding the comb pattern of the phosphor-doped poly-Si layer 11, which has a length of the surface in the vertical direction of the wall-shaped body greater than the width of the bottom surface, on the base. After the creation of the capacitor is completed, the unnecessary portions can be eliminated. Actually, while such elimination is not necessarily required, it is better to eliminate the unnecessary portions in order to make the device small in size.

Figure 21:
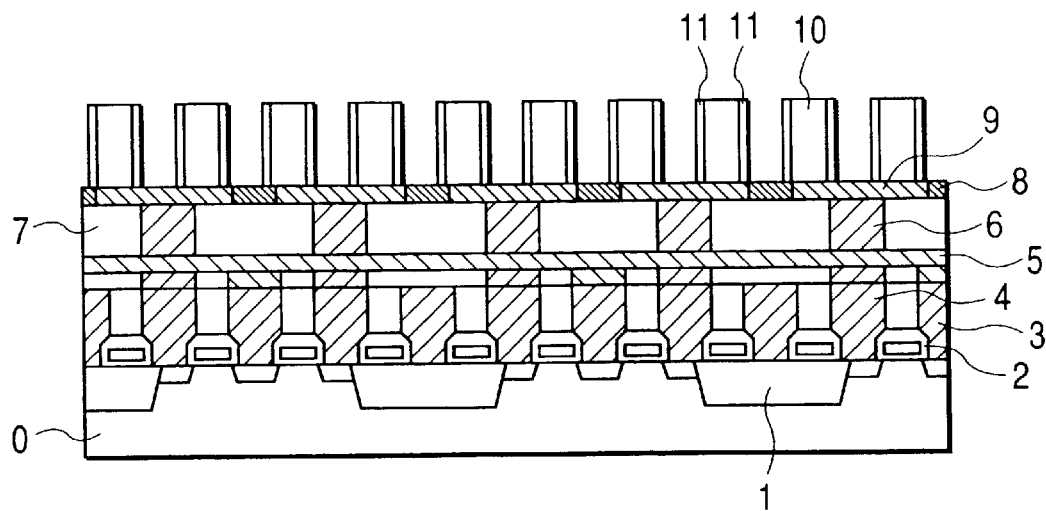
FIG. 21 is a model cross-sectional diagram showing a further step in the process of fabricating a capacitor employed in a memory mat of a semiconductor device provided by the present invention.
Figure 22:
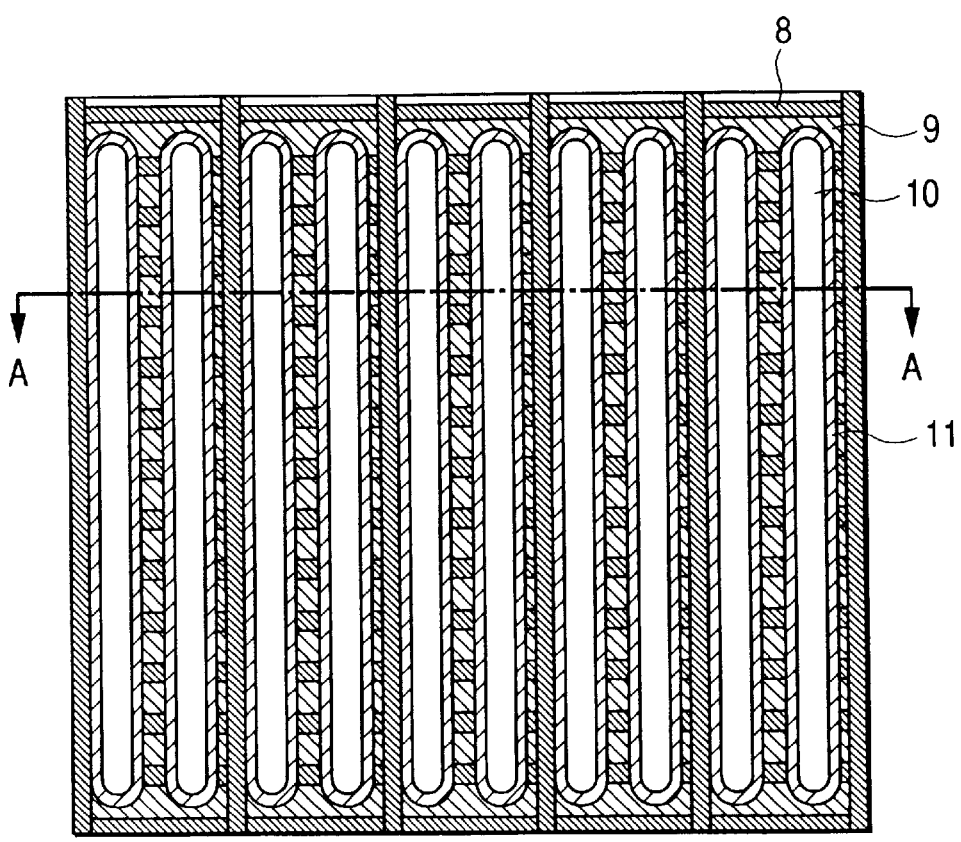
FIG. 22 is a top-view diagram showing the process of fabricating a capacitor employed in a memory mat of a semiconductor device provided by the present invention shown in FIG. 21.
Figure 23:
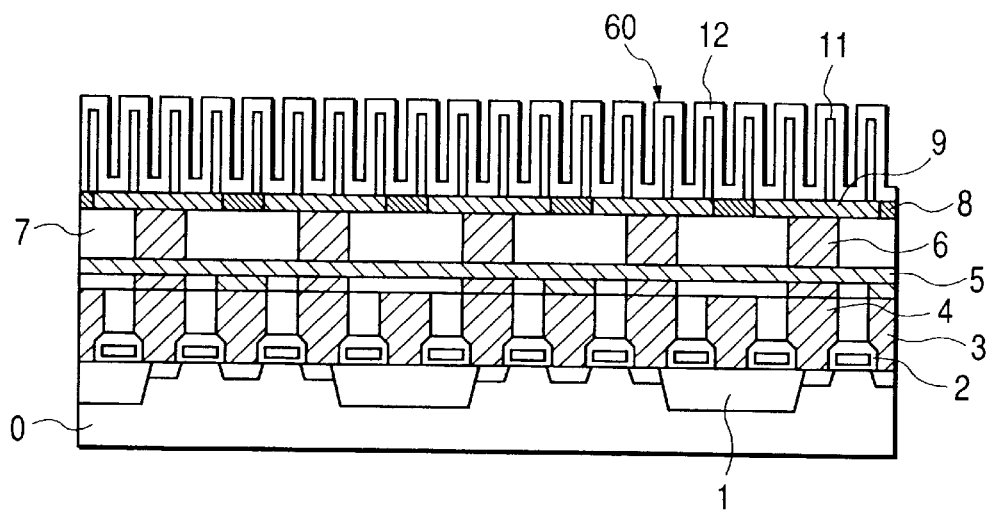
FIG. 23 is a model cross-sectional diagram showing a further step in the process of fabricating a capacitor employed in a memory mat of a semiconductor device provided by the present invention.
Figure 24:
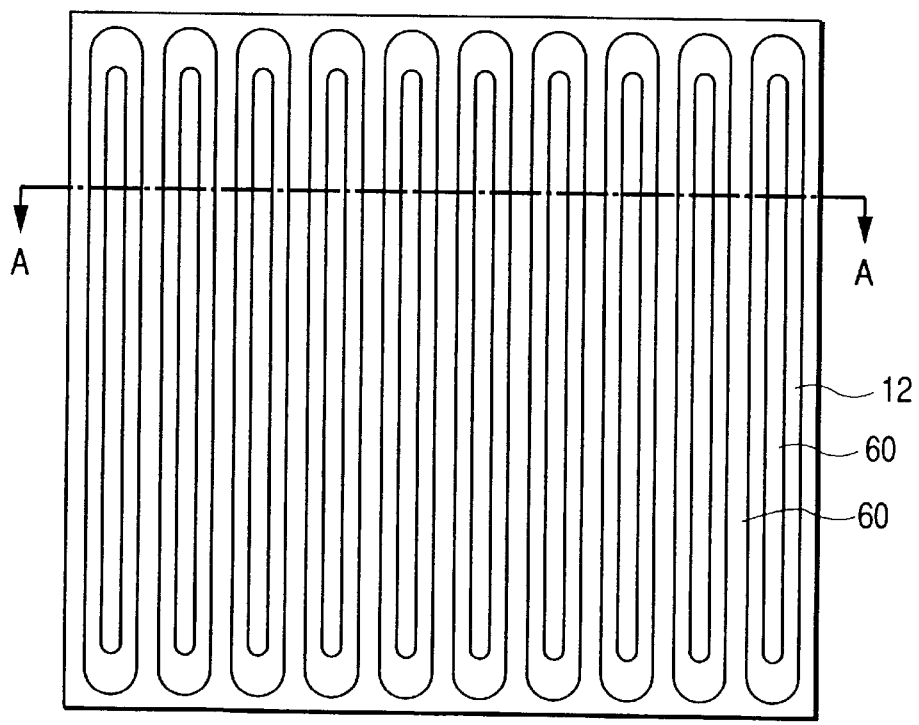
FIG. 24 is a top-view diagram showing the process of fabricating a capacitor employed in a memory mat of a semiconductor device provided by the present invention shown in FIG. 23.

(d-3) An $SiO_2$ layer 12 is created on the surface in the state shown in FIG. 21 by adopting the CVD method as shown in the cross-sectional diagram of FIG. 23. A top-view diagram of FIG. 24 shows patterns of the uppermost layer $SiO_2$. The thickness of the $SiO_2$ layer 12 is the thickness of the insulation layer for the capacitor plus the thickness of the upper electrode. That is, a dent 60 sandwiched by the patterns of the $SiO_2$ layer 12 is filled up with a poly-Si layer 13 in a later process. The wall-shaped body of this poly-Si layer 13 is made a portion of the lower electrode of the capacitor. Furthermore, this $SiO_2$ layer 12 is replaced by an insulation film for the final capacitor in a later process. Thus, the thickness of the $SiO_2$ layer 12 virtually determines and controls the thickness of the insulation layer for the capacitor.

Figure 25:
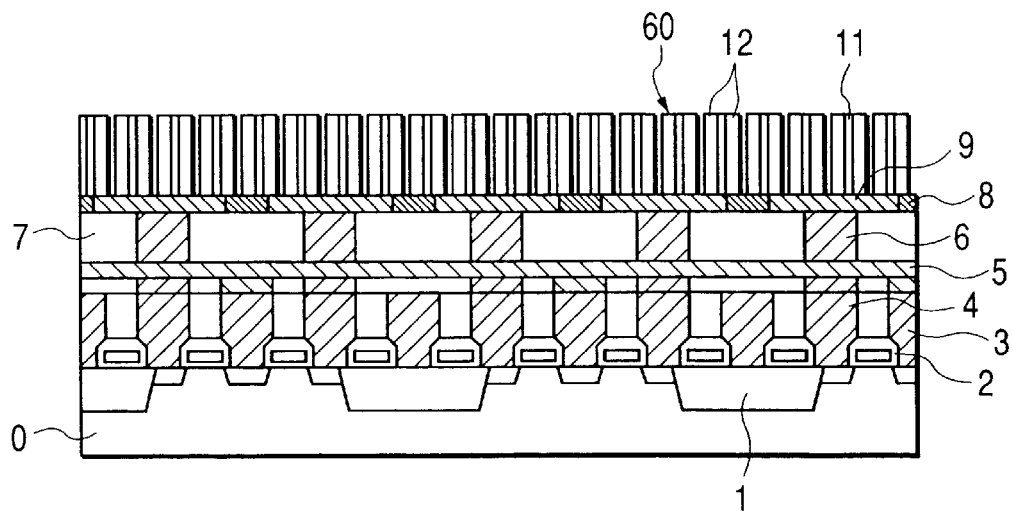
FIG. 25 is a model cross-sectional diagram showing a further step in the process of fabricating a capacitor employed in a memory mat of a semiconductor device provided by the present invention.
Figure 26:
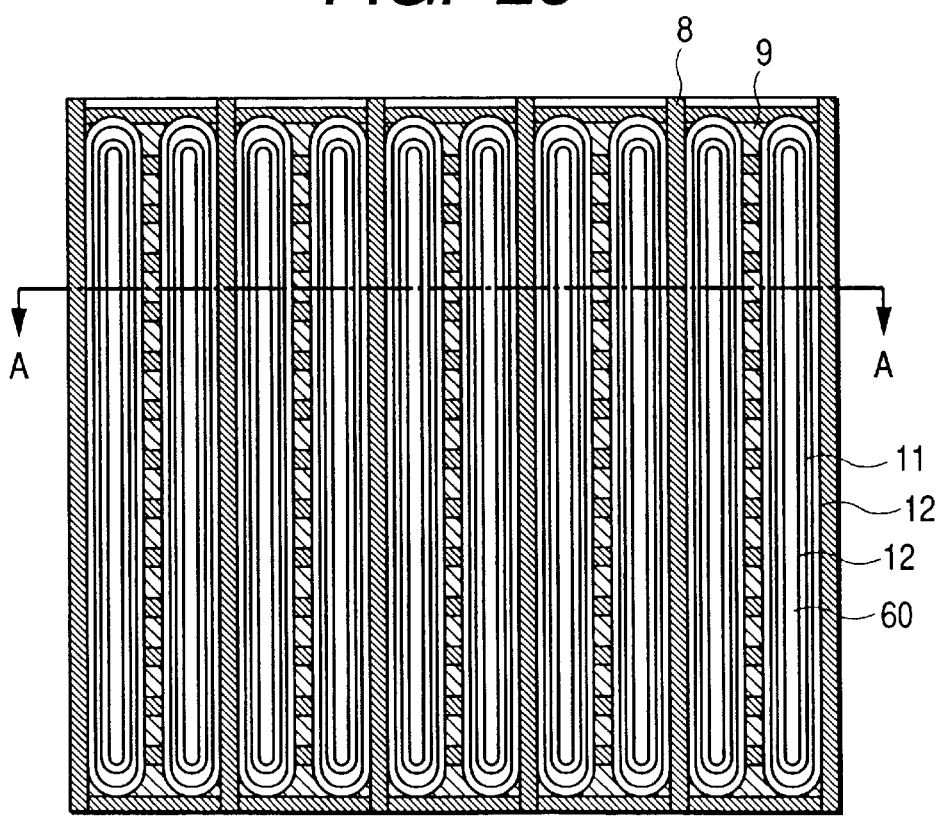
FIG. 26 is a top-view diagram showing the process of fabricating a capacitor employed in a memory mat of a semiconductor device provided by the present invention shown in FIG. 25.

Then, this $SiO_2$ layer is etched back as shown in a cross-sectional diagram of FIG. 25 and a top-view diagram of FIG. 26. As described above, at that time, spaces are formed between the wall-shaped bodies of a plurality of $SiO_2$ layers 12.

Figure 27:
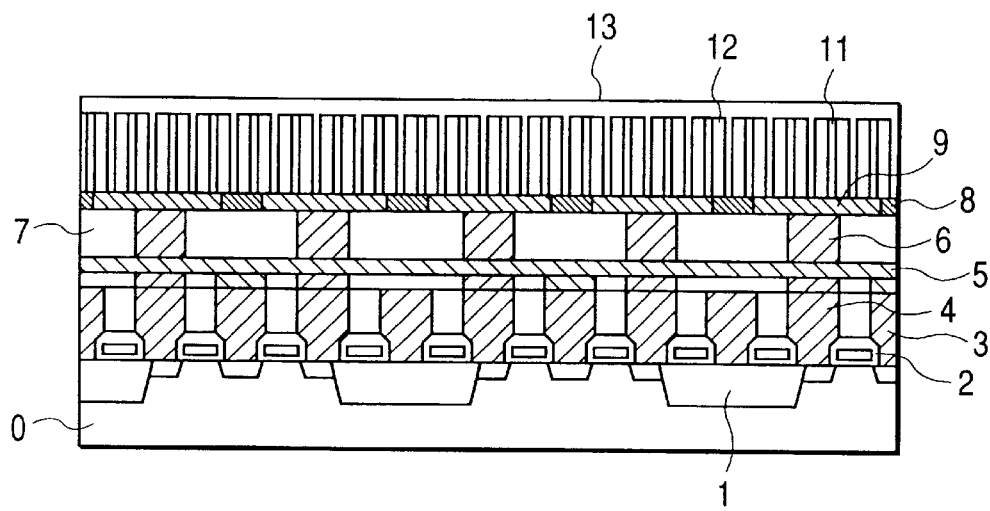
FIG. 27 is a model cross-sectional diagram showing a further step in the process of fabricating a capacitor employed in a memory mat of a semiconductor device provided by the present invention.

(d-4) A phosphor-doped poly-Si layer 13 is formed again above them by using the CVD method as shown in FIG. 27. At that time, the poly-Si layer 13 is formed to fill up the space shown in FIG. 25.

Figure 28:
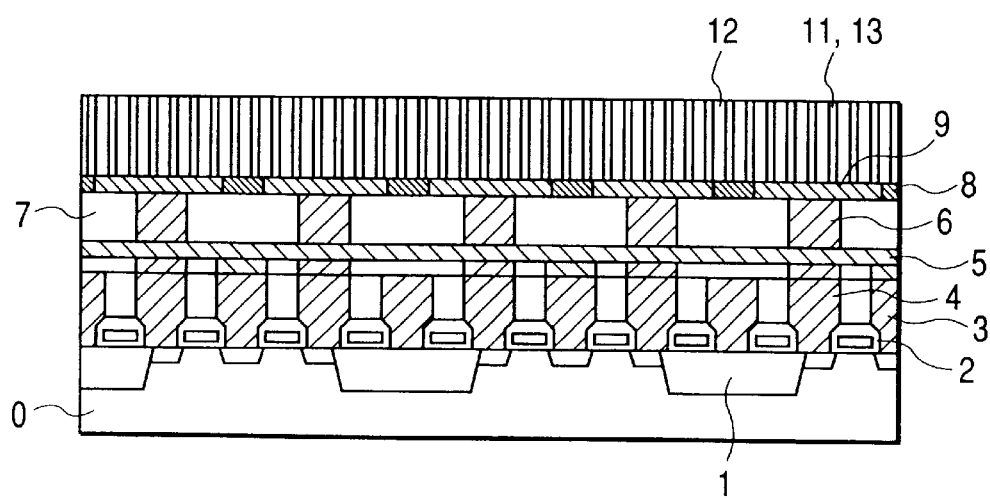
FIG. 28 is a model cross-sectional diagram showing a further step in the process of fabricating a capacitor employed in a memory mat of a semiconductor device provided by the present invention.
Figure 29:
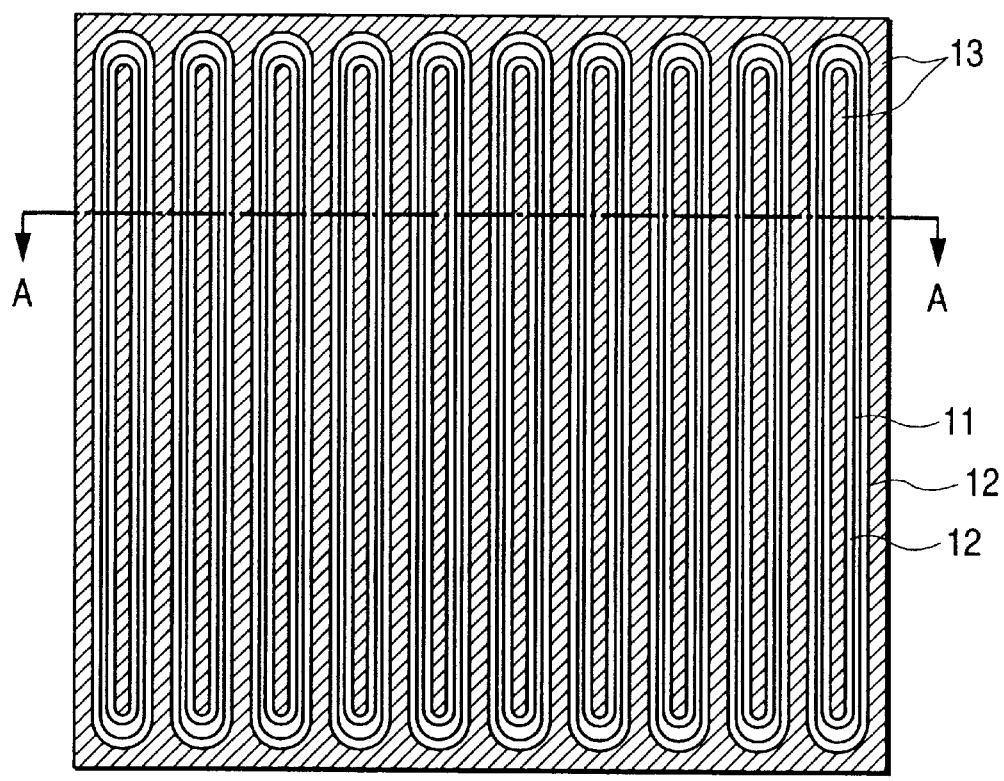
FIG. 29 is a top-view diagram showing the process of fabricating a capacitor employed in a memory mat of a semiconductor device provided by the present invention shown in FIG. 28.

The upper portion of the semiconductor substrate in the state shown in FIG. 27 is flattened by adopting the commonly known etch-back technique or another technique such as a CMP (Chemical Mechanical Polishing) method. FIG. 28 is a diagram showing a cross section of a state resulting from the flattening and FIG. 29 is a diagram showing the top view of the state. Comb-shaped patterns of the poly-Si layers 11 and 13, the gaps of which are filled with the $SiO_2$ layers 12, are created.

Figure 30:
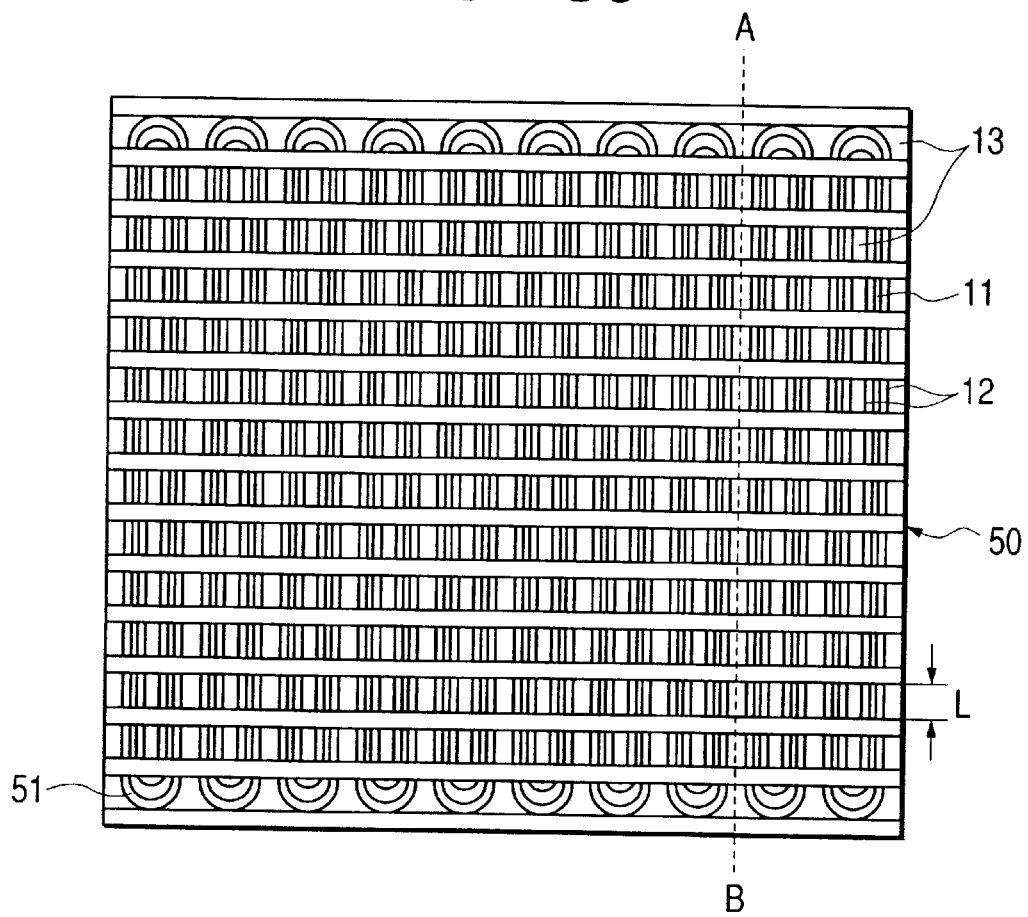
FIG. 30 is a top-view diagram showing the process of fabricating a capacitor employed in a memory mat of a semiconductor device provided by the present invention shown in FIG. 31.
Figure 31:
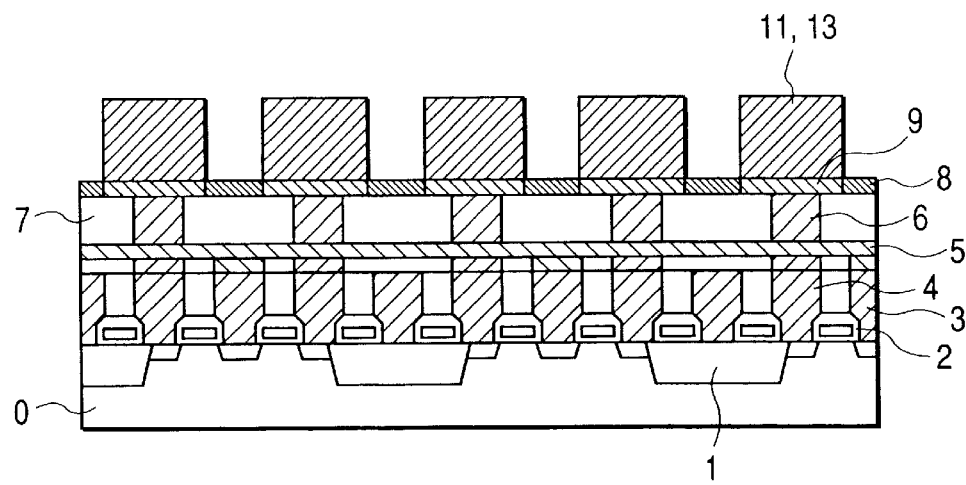
FIG. 31 is a model cross-sectional diagram showing a process of fabricating a capacitor employed in a memory mat of a semiconductor device provided by the present invention.

The phosphor-doped poly-Si layers 12 and 13 are fabricated into a predetermined form by using a hard mask of typically an $SiO_2$ layer. FIG. 30 is a diagram showing a top view of this state whereas FIG. 31 is a diagram showing a cross section along a line AB in FIG. 30. It should be noted that the remaining portions 51 each having a semicircular shape on the upper and lower edges are portions not required in the final semiconductor device as described earlier.

Portions indicated by an arrow 50 are the result of the hot etching process described earlier whereas the comb patterns of the phosphor-doped poly-Si layers 12 and 13 are cut in memory-cell units in a direction parallel to the word line. A length denoted by the letter 'L' in FIG. 30 is the length of the memory-cell unit.

(d-5) The $SiO_2$ layer 12 is removed from the semiconductor substrate in the state shown in FIG. 30 by using the generally known wet etching process. In this way, a predetermined gap is formed between a plurality of second wall-shaped conductive layers 13 and a plurality of first wall-shaped layers 11 which constitute the wall-shaped body of the capacitor.

Figure 32:
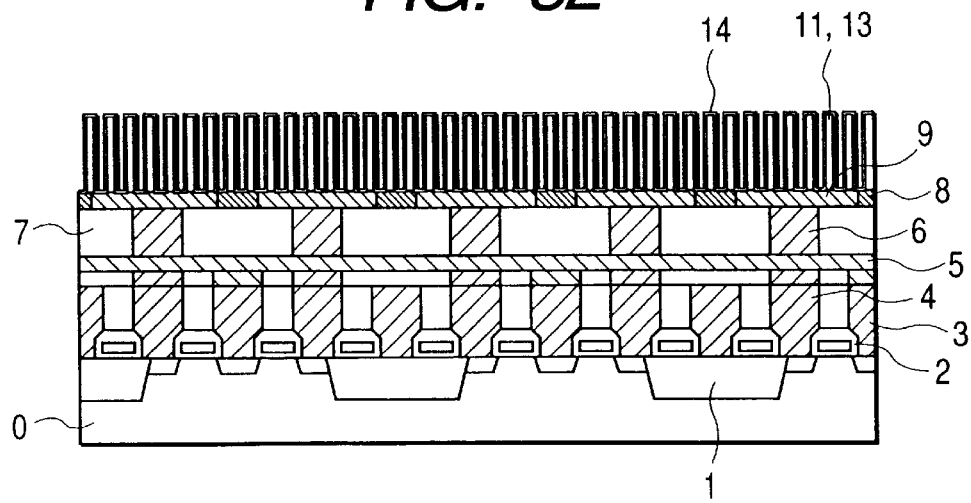
FIG. 32 is a model cross-sectional diagram showing a process of fabricating a capacitor employed in a memory mat of a semiconductor device provided by the present invention.

(e) Then, the surfaces of the lower electrodes 11 and 13, which are the bottom 9 of the phosphor-doped poly-Si layer, are nitrided in an $NH_3$ atmosphere and a $Ta_2O_5$, layer 14 is created on the upper surface by using the CVD method. The created $Ta_2O_5$ layer 14 is subjected to a heat treatment in an oxidizing atmosphere at a temperature of at least 700 degrees Celsius to be crystallized as shown in FIG. 32. It should be noted that the $Ta_2O_5$ layer 14 is not shown in FIGS. 32 and 33 due to a limitation on the size of the figures. Thus, in these figures, the surface of the phosphor-doped poly-Si layer can be interpreted as the $Ta_2O_5$ layer 14.

Figure 33:
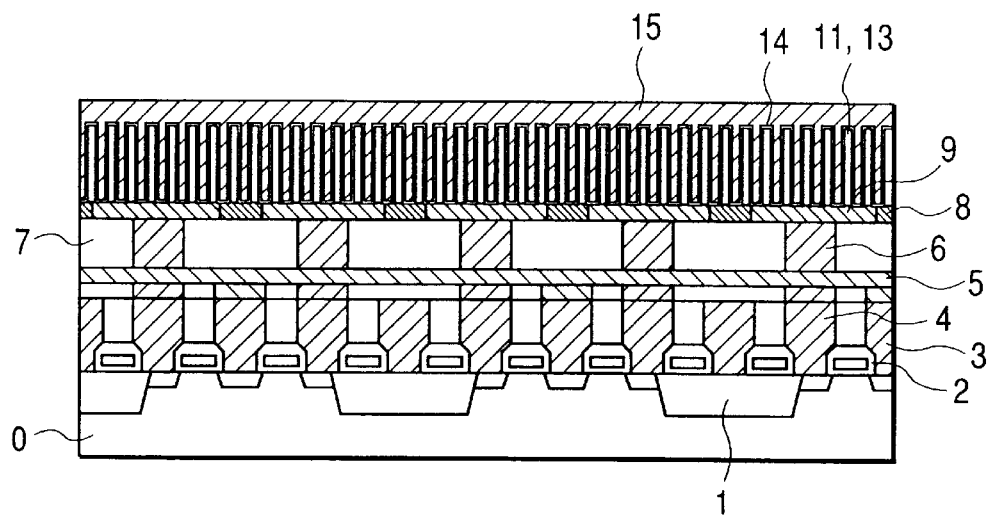
FIG. 33 is a model cross-sectional diagram showing a further step in the process of fabricating a capacitor employed in a memory mat of a semiconductor device provided by the present invention.

(f) Then, an upper electrode made of TiN15 is created by using the CVD method as shown in a cross-sectional diagram of FIG. 33.

A desired wiring process is further carried out to produce the semiconductor device.

Figure 34A:
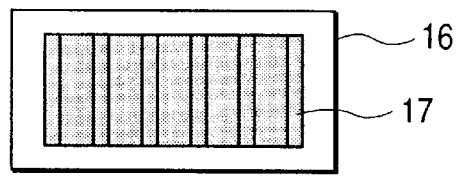
FIGS. 34(a) and 34(b) are diagrams showing a top view, respectively, and a cross-sectional view of a typical layout of lower electrodes provided by the present invention.
Figure 34B:
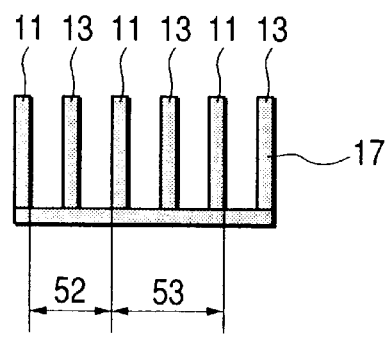

FIG. 34(a) is a diagram showing a top view of the lower electrode of a capacitor cell created by using the methods described above. FIG. 34(b) is a diagram showing a cross section of the structure of the lower electrode of the capacitor, that is, a cross section seen from the direction of a bit line. A length indicated by an arrow in FIG. 34(b) and denoted by a reference numeral 52 or 53 is a dimension determined by lithography. Reference numeral 16 denotes the area of 1 cell and reference numeral 17 denotes the lower electrode. With this structure, it is possible to obtain a capacitor with a capacitance of about 1.7 times the capacitance of a crown-type capacitor with an equal height.

Figure 35:
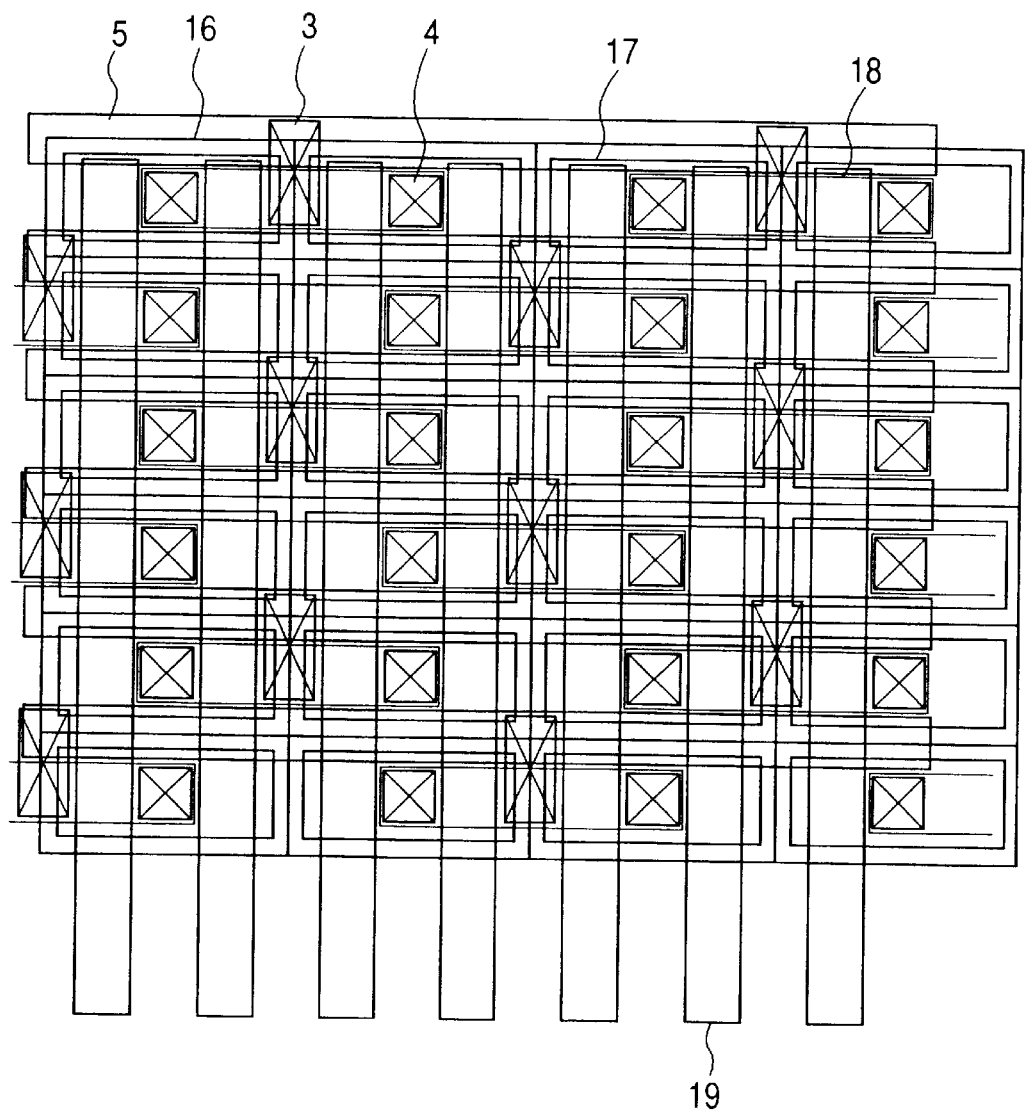
FIG. 35 is a diagram showing a layout of memory cells employed in a semiconductor device provided by the present invention.

FIG. 35 is a diagram showing a top view of the layout of capacitors created by using the methods described above. In the figure, reference numerals 19 and 5 denote a word line and a bit line, respectively. Reference numeral 3 denotes a bit-line contact and reference numeral 4 denotes a storage contact. Reference numerals 18 and 16 denote an active area and the area of one cell, respectively. Reference numeral 17 denotes the lower electrode. It should be noted that the positions indicated in the diagram of FIG. 35, which represent a top view of the layout of the capacitors, do not accurately agree with the corresponding positions indicated in the cross-sectional diagrams of the embodiments given so far. The relative positions in the horizontal direction between members are shown in FIG. 35. The cross-sectional diagrams given so far mainly show relative positions in the vertical direction between transistors and members of the semiconductor device. There are a number of conceivable planar layouts of members such as memory cells and storage-node contacts as will be exemplified by embodiments described below.

In the embodiment shown in FIG. 35, the bit-line contacts 3 are placed on every other row.

Figure 36:
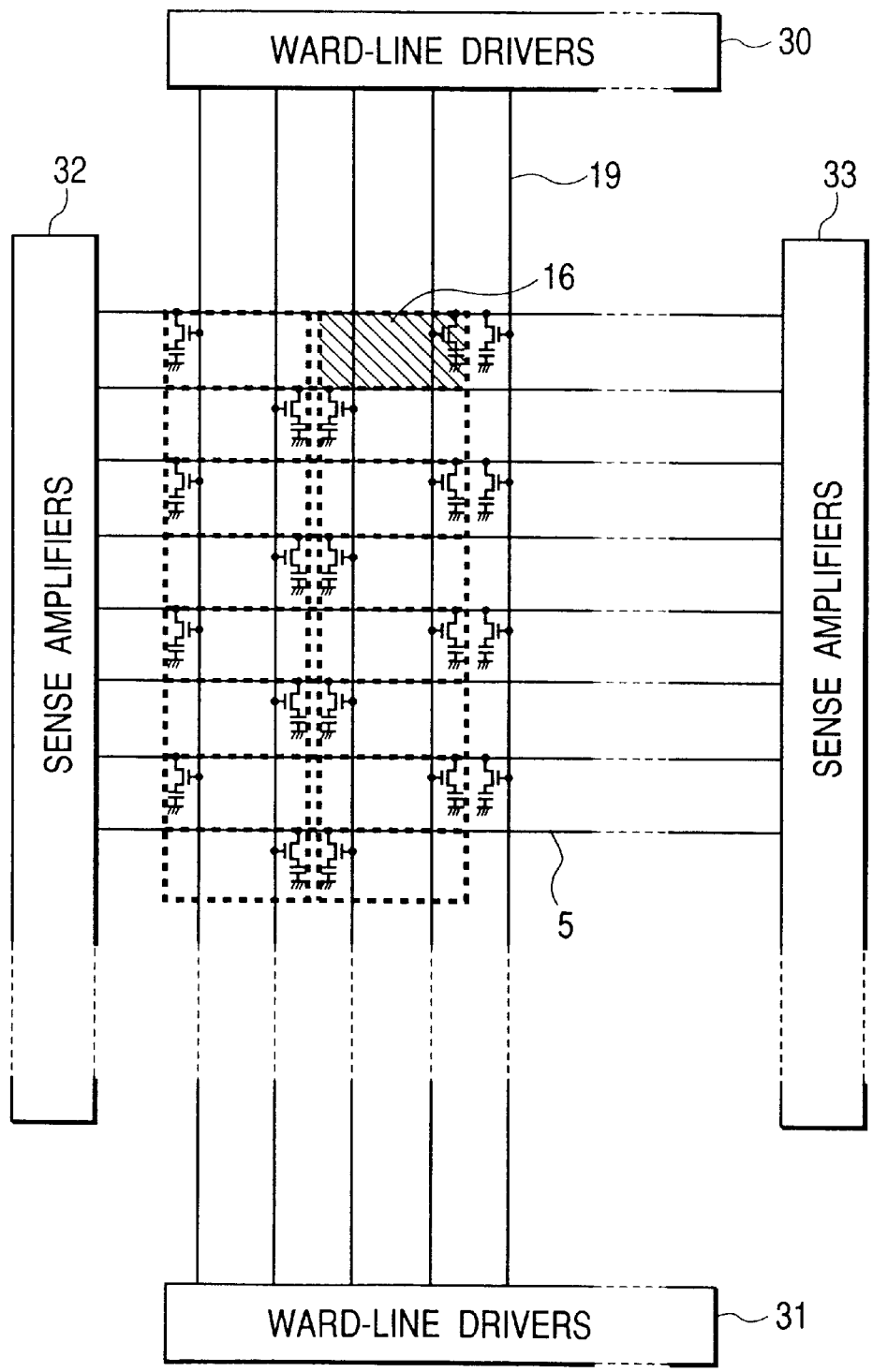
FIG. 36 is a circuit diagram of a typical memory mat provided by the present invention.

FIG. 36 is a circuit diagram showing a memory area of a first embodiment. A hatched area enclosed by dotted lines in FIG. 36 is an area occupied by one memory cell 16. Each memory cell 16 is connected by a bit line 5 to a sense amplifier 32 or 33. On the other hand, a memory cell 16 is connected by a word line 19 to a word-line driver 30 or 31.

Note that it is desirable to form contiguous storage nodes on 1 memory mat shown in FIG. 36, that is, storage nodes which are not delimited. It is also desirable to create a semicircular portion at the pattern end in a space between the memory-mat portion and a peripheral-circuit portion. In addition, in the fabrication at a point of time corresponding to the state shown in FIG. 30, the semicircular portion can be removed.

The following process can also be carried out on the first embodiment. This fabrication is a fabrication of the bottom surface of a capacitor in the first embodiment.

In the process described above, after the $Si_3N_4$ layer 8 is created and the desired process is implemented, the phosphor-doped poly-Si layer 9 is created. Then, in this state, the surface of the semiconductor substrate is flattened to approximately the height of the $Si_3N_4$ layer 8. Refer to FIGS. 13 to 18. In addition, the following modified process is also conceivable.

In this modified version of the embodiment, the order of the formation of the phosphor-doped poly-Si layer 9 and the formation of the $Si_3N_4$ layer 8 is reversed. First of all, the phosphor-doped poly-Si layer is formed and fabricated to a desired shape. Then, a poly-Si layer is again created using the CVD method and this layer etched back so that its side wall remains. Then, the $Si_3N_4$ layer is created and its surface is flattened. At that time, by adjusting the film thickness of the poly-Si layer by adoption of the CVD method, bottom surfaces of the lower electrode can be created separately from each other by a predetermined gap. Depending on the size of the capacitor, fabrication can be carried out once by using a photo-etching or EB (electron beam) technique.

The following description explains how the gap between the bottoms of the capacitor is optimized or how the bottom is adjusted relative to the vertical portion. It is needless to say that the optimizations can be applied to a variety of embodiments described later in this specification in exactly the same way.

In the basic fabrication of the embodiments described above, the gap (d) between bottoms of the capacitor, the thickness (x) of the wall-shaped body of the capacitor and the gap (y) between the wall-shaped bodies are set to satisfy the following relation: $x<d<(x+y)$. Under this condition, capacitors aligned in a direction parallel to the bit line are by no means short-circuited without regard to how the wall-shaped body is adjusted to the bottom of the capacitor. Thus, according to this method, the area can be utilized effectively and a capacitor with the largest possible area can thus be obtained. It should be noted that, in this case, the gap (d) between the bottoms of the capacitor is a gap between conductors supporting the wall-shaped bodies which are the phosphor-doped poly-Si layers 9 in this example. FIG. 12 shows the relation between x, y and d.

In addition, the length z of the capacitor in one direction normally satisfies the following equation: $z=n(x+y)$ where the symbol x denotes the thickness of the wall-shaped body of the capacitor, the symbol y denotes the gap between the wall-shaped bodies and the symbol n is a natural number.

It should be noted that, in the process (d-3), flattening fabrication to the final shape of the memory cell as a batch process including a portion having a cubic structure can be carried out by using a photo resist and a hard mask after flattening the upper portion of the capacitor at the stage shown in FIG. 23.

In addition, it is quite within the bounds of possibility that a wall-shaped body of an $SiO_2$ layer collapses during a fabrication process due to the fact that the bottom of the wall-shape body is small. This problem of strength can be basically solved by using the following method. In the basic processes of the embodiment described above, the process (c) to the process (d-3) or the processes shown in FIGS. 19 to 23 and the process (d-4) to the process (f) or the processes shown in FIGS. 19 to 23 are carried out continuously and members are created in situ. By doing so, the problem of a pattern collapse after a wet-etching process of an $SiO_2$ layer can be solved.

Materials commonly known in the fields of semiconductor devices in general and semiconductor memories in particular can be used for making members of the semiconductor device provided by the present invention. Some explanations on this are given below. Note that it is needless to say that the following explanations can also be applied to implementations other than the embodiments described so far in exactly the same way. Examples of the implementations of the embodiments will be described.

In the embodiments described so far, a $Ta_2O_5$ film is used as the insulation film 12 of the capacitor and a TiN film created by the CVD method is used as the upper electrode 13. However, materials that can be used for making the film 12 and the electrode 13 are not limited to $Ta_2O$ and TiN, respectively. For example, the insulation film 12 can be made of an ordinary material. As an alternative, an $SiO_2$ or $Si_3N_4$ stacked-layer film can also be used as the insulation film 12 for the capacitor.

By the same token, the upper electrode 13 can also be made of an ordinary material. For example, a phosphor-doped poly-Si layer can be used as the upper electrode 13. In either case, the effect of an increased capacitor area equivalent to the embodiments described so far can be obtained.

In addition, in the embodiments described above, a phosphor-doped poly-Si layer is used as the lower electrode. It should be noted, however, that a capacitor having an even larger capacitance can be obtained, for example, by using the following materials as the lower electrode:

(a) a heat-tolerant metallic layer made of W, Ti, Ta or the like.

(b) a conductive film made of a compound material comprising the metals (a), silicon and nitrogen.

(c) a stacked-layer film made of Pt, Ru, $RuO_2$, Ir and/or $IrO_2$.

(d) a stacked-layer film made of a variety of materials for making the lower electrode.

The upper electrode can also be made of a variety of conductive films and the stacked-layer films for making the lower electrode.

It is of course possible to use a ferroelectric film such as barium titan oxide strontium (BST), titan oxide strontium or zinc titan oxide strontium (PZT) as the insulation film for the capacitor. By using any of these materials, a capacitor with a large capacity can be implemented.

Figure 47:
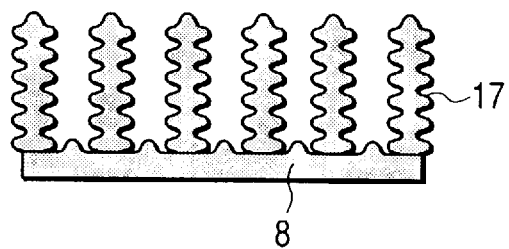
FIG. 47 is a diagram showing a cross section of a typical lower-electrode structure provided by the present invention.

In addition, by roughening the surface of the lower electrode using a commonly known method, as shown in FIG. 47, the area of the capacitor electrode can be increased. Thus, by using such a rough surface, the capacity can be increased to 1.2 to 2 times the capacity of a capacitor not using a rough surface. A generally known method can be adopted as a technique for roughening the surface.

Capacitor Stretched Over a Plurality of Cell Areas 1 Cell Areas and Capacitors

The following is a description of embodiments of the present invention wherein a capacitor is created so as to be stretched over a plurality of cells. In addition, in the following embodiments, contrivances are added to a connection of a source area to a storage node.

Figure 37A:
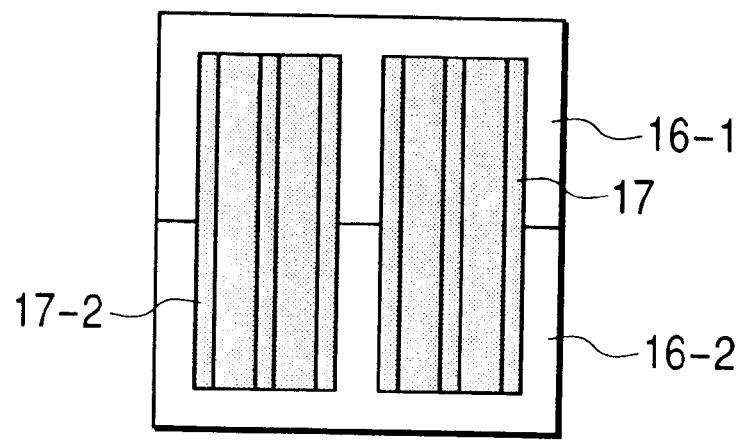
FIGS. 37(a) and 37(b) are diagrams showing a top view and a cross-sectional view, respectively, of another typical layout of lower electrodes provided by the present invention.
Figure 37B:
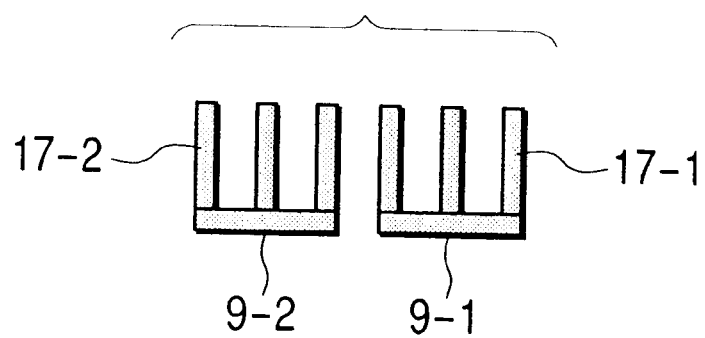

FIG. 37(a) is a model diagram showing a top view of the short side and the long side of a memory cell. That is, the diagram shows a top view of the structure of the lower electrode. In the embodiment shown in this figure, two capacitors 17-1 and 17-2 are created so as to be stretched over two memory-cell areas 16-1 and 16-2, which are laid out contiguously in the direction of a word line. To be more specific, the two capacitors 17-1 and 17-2 are provided in the direction of the long side of the memory cell. FIG. 37(b) is a diagram showing a cross section of the lower electrode in the direction of the long side of the memory cell or the direction of the bit line in the case of this embodiment. The figure shows only the lower electrodes of the capacitors 17-1 and 17-2. Reference numerals 9-1 and 9-2 each denote a member constituting the bottom of the lower electrode. More specifically, the members 9-1 and 9-2 are each formed of the phosphor-doped poly Si layer 9 described earlier.

It should be noted that, in this case, the number of wall-shaped portions of one capacitor can be two or greater. It is desirable to create as many wall-shaped portions of one capacitor as possible.

Figure 38:
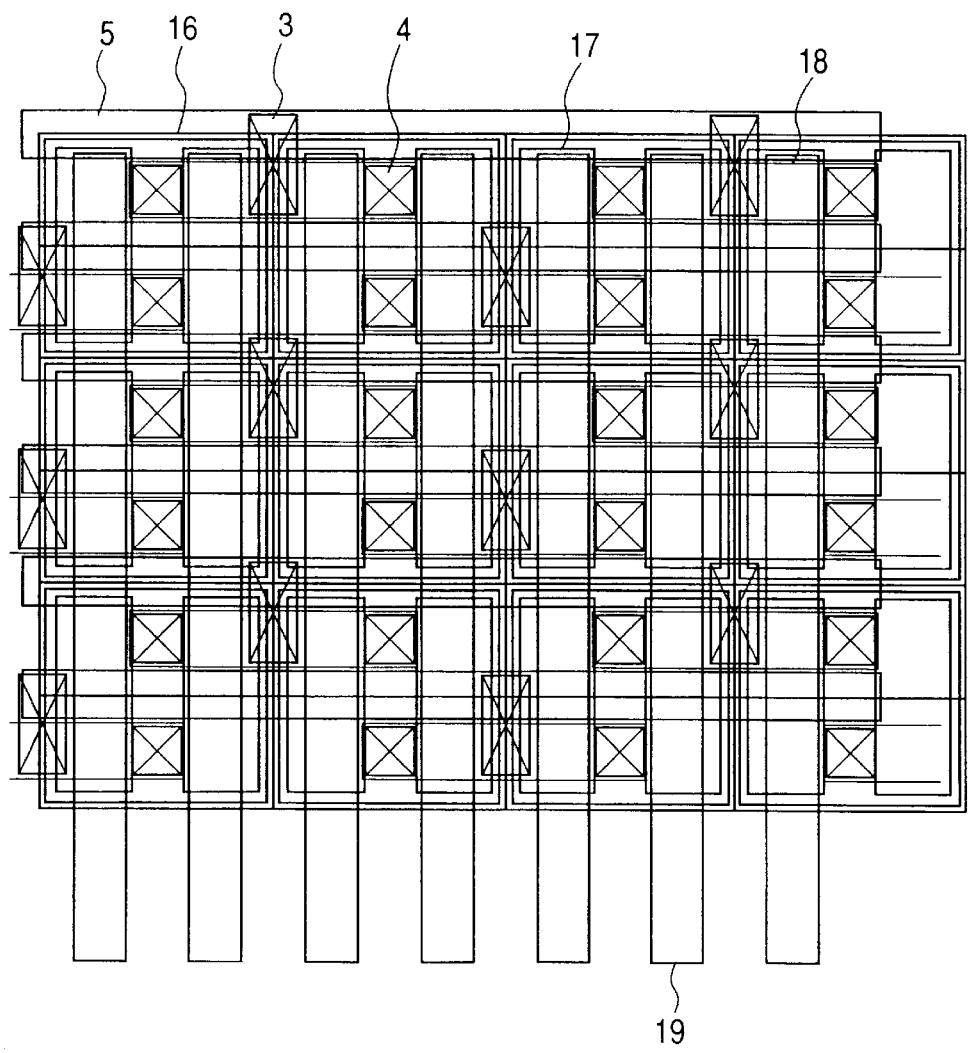
FIG. 38 is a diagram showing another layout of memory cells employed in a semiconductor device provided by the present invention.
Figure 39:
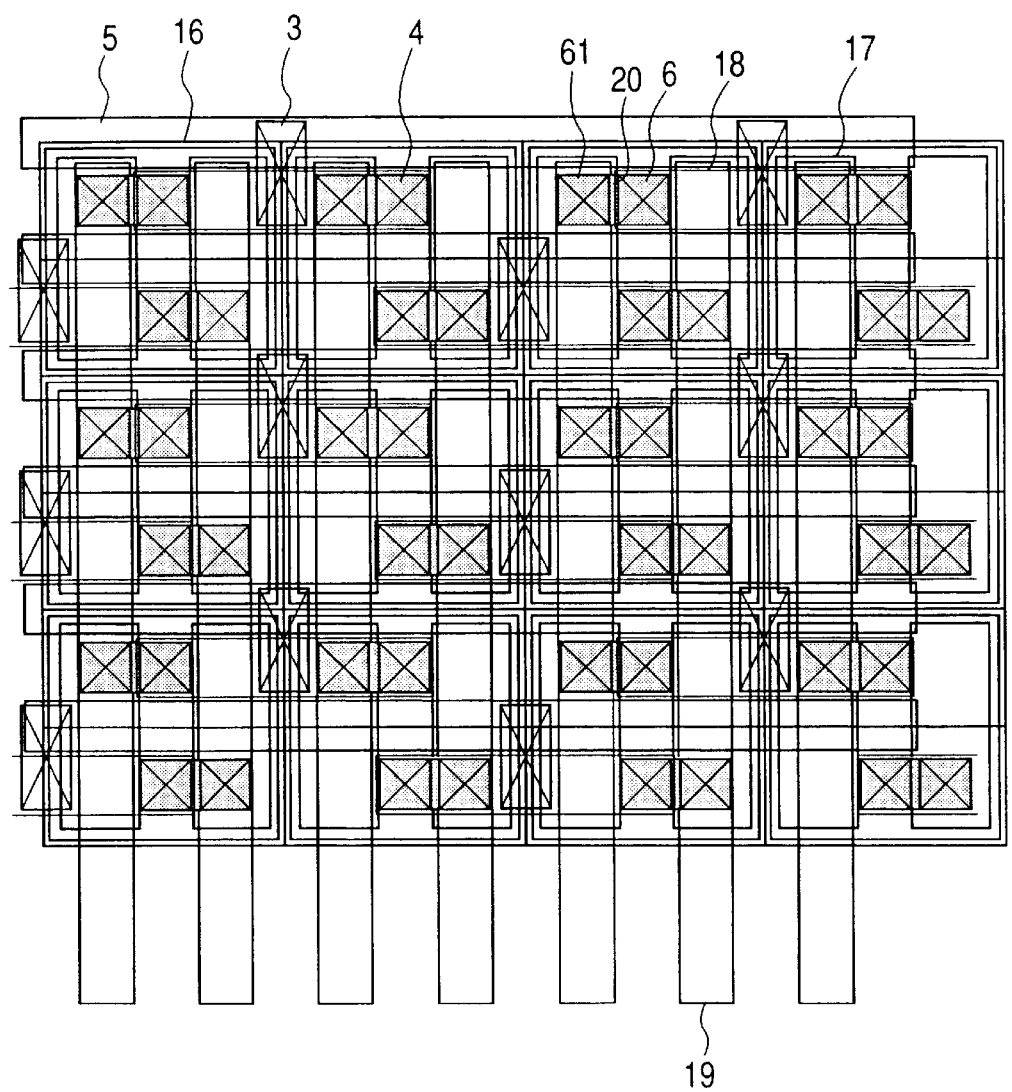
FIG. 39 is a diagram showing a layout of storage-node contacts of memory cells employed in a semiconductor device provided by the present invention.

FIG. 38 is a diagram showing a concrete layout of capacitors and memory cells. That is, FIG. 38 depicts what is conceptually shown in FIG. 37 in more specific terms. FIG. 39 is a diagram showing a typical method of electrically connecting storage nodes to source areas. In FIGS. 38 and 39, reference numerals 19 and 5 denote a word line and a bit line, respectively. Reference numeral 3 denotes a bit-line contact and reference numeral 4 denotes a storage contact. Reference numerals 6 and 61 denote a storage-node contact and an extended storage-node contact, respectively. Reference numeral 18 denotes an active area and reference numeral 16 denotes an area of 1 cell. Reference numeral 17 denotes a lower electrode and reference numeral 20 denotes a conductor for connecting the storage-node contact 6 to the extended storage-node contact 61. As shown in FIG. 38, memory cells are repeated in units of two memory cells. FIG. 38 thus shows an embodiment wherein two capacitors 17-1 and 17-2 are created so as to be stretched over two memory-cell areas 16-1 and 16-2, which are laid out contiguously in the direction of a word line, as has been conceptually explained previously.

2 Layout of Storage Nodes and Others

Next, typical connections of source areas and storage nodes will be explained mainly from a layout point of view. An SN (storage-node) contact is not placed right above a source area. Instead, the contact position of the SN contact with the upper portion of the source area is shifted in the direction of the bit line.

In this embodiment, memory cells are repeated in units of two memory cells. An SN contact 6 pulled out from a source area is shifted by using a conductive layer 20 in the direction of the bit line to extend the SN contact 6 to the shifted position. At this position, the source area is connected to the storage node.

Figure 40:
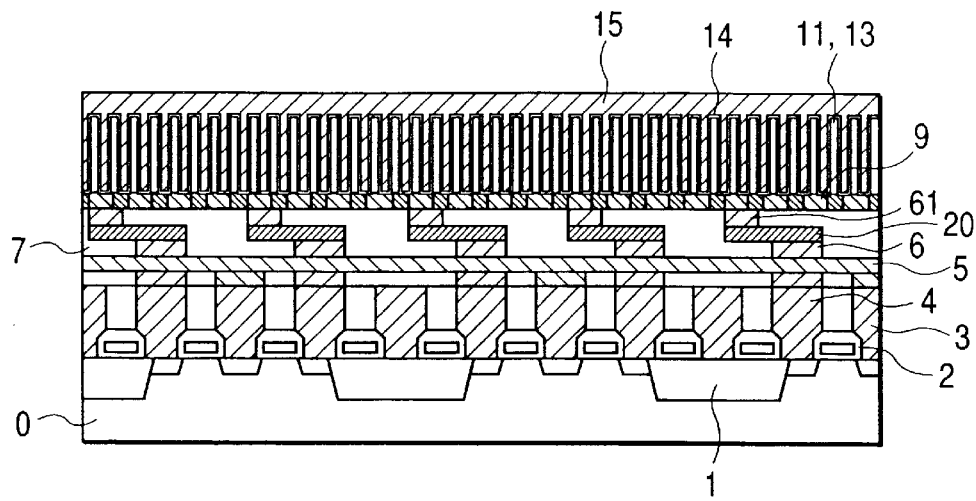
FIG. 40 is a model cross-sectional diagram showing another process of fabricating a capacitor employed in a memory mat of a semiconductor device provided by the present invention.
Figure 41:
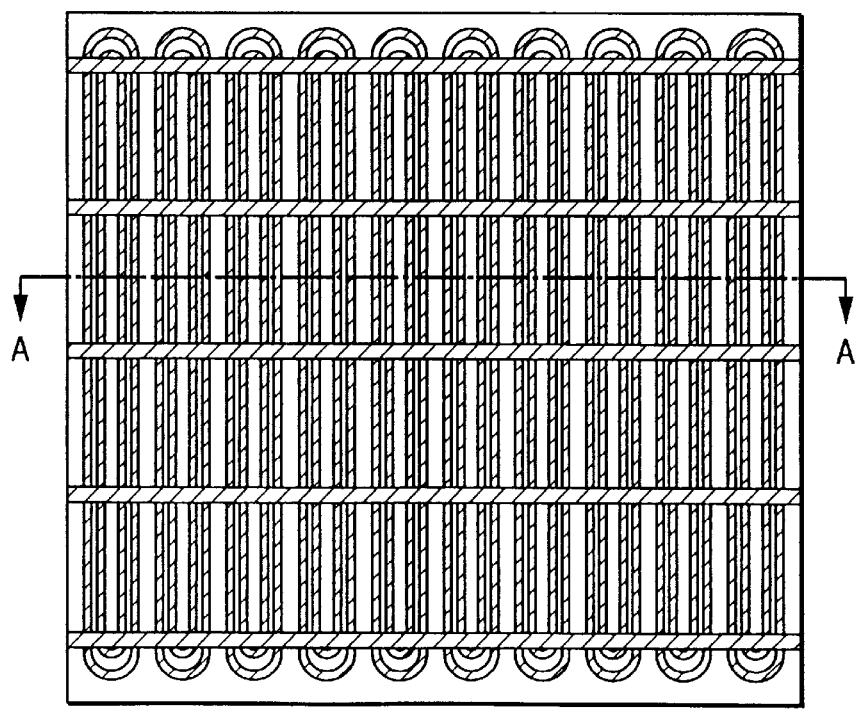
FIG. 41 is a top-view diagram showing the process of fabricating a capacitor employed in a memory mat of a semiconductor device provided by the present invention shown in FIG. 40.

FIG. 40 is a diagram showing a cross section of this embodiment and FIG. 41 is a diagram showing a top view thereof. The stacking of the source area, the storage contact 4, the storage contact 6, the conductive layer 20 and the extended storage contact 61 can be clearly understood by referring to FIG. 40. Other structures shown in FIGS. 40 and 41 are the same as those shown in FIG. 33.

Figure 42:
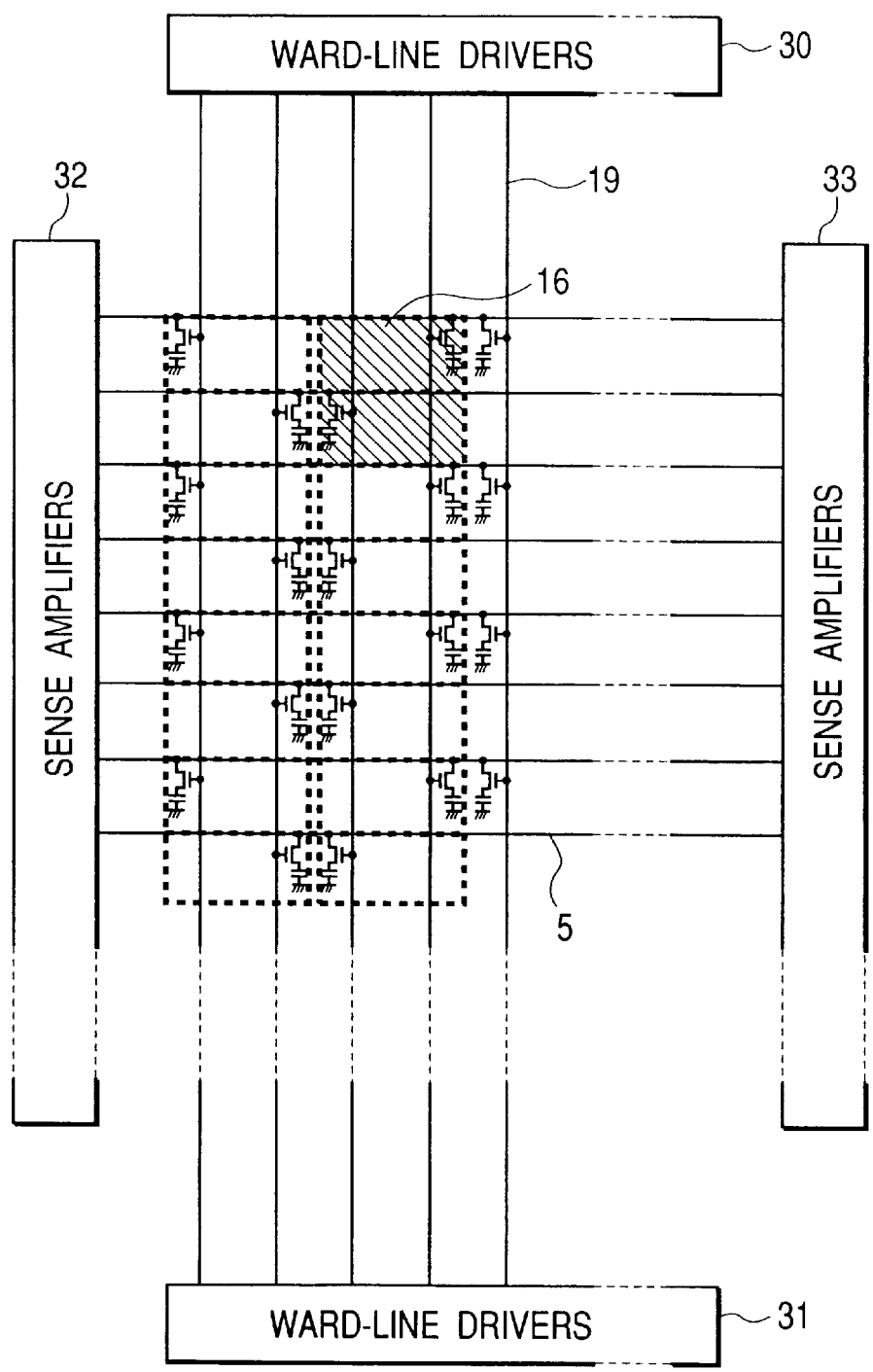
FIG. 42 is a circuit diagram of another typical memory mat provided by the present invention.

FIG. 42 is a circuit diagram showing the embodiment. The shaded rectangular portion represents a unit. In this example, a unit comprises two cells. Except for the change in one-unit configuration, the other basic structures are the same as those shown in FIG. 36.

Other Embodiments

Figure 43A:
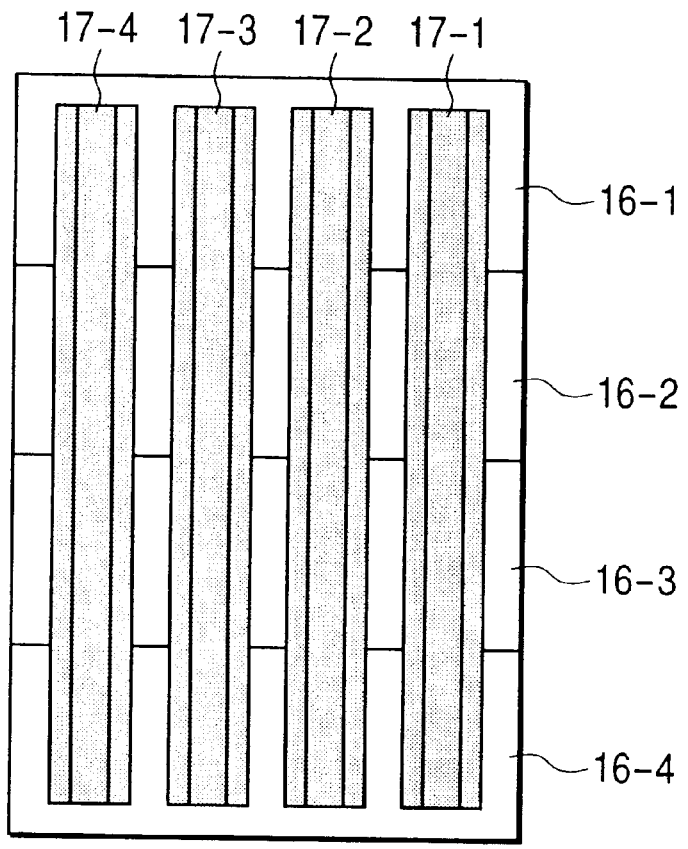
FIGS. 43(a) and 43(b) is diagrams showing a top view and a cross-sectional view, respectively, of another typical layout of lower electrodes provided by the present invention.

In another embodiment, four capacitors are created for four cells which are laid out contiguously in the direction of the word line. Much like FIG. 37(a), FIG. 43(a) is an explanatory diagram conceptually showing main components. In this case, it is needless to say that the number of-wall-shaped portions of a capacitor can be two or greater. It is desirable to create as-many wall-shaped portions of one capacitor as possible.

Figure 43B:
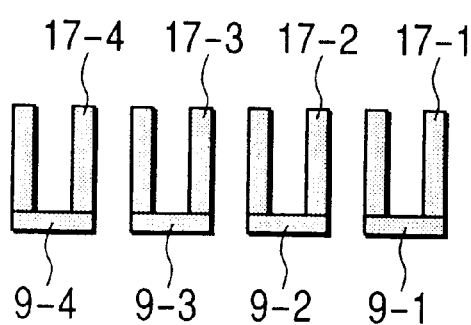

Four capacitors are provided in the direction of the long side of the cell. More specifically, the four capacitors, the lower electrodes of which are denoted by reference numerals 17-1, 17-2, 17-3 and 17-4, are created in this embodiment, being stretched over four cell areas 16-1, 16-2, 16-3 and 16-4, respectively, which are laid out contiguously in the direction of the word line. Much like FIG. 37(b), FIG. 43(b) is a diagram showing a cross section of the lower electrodes in the direction of a bit line. Reference numerals 9-1, 9-2, 9-3 and 9-4 each denote a member constituting the bottom of the lower electrode. As an example, the member may be formed of a phosphor-doped poly-Si layer 9.

Figure 44:
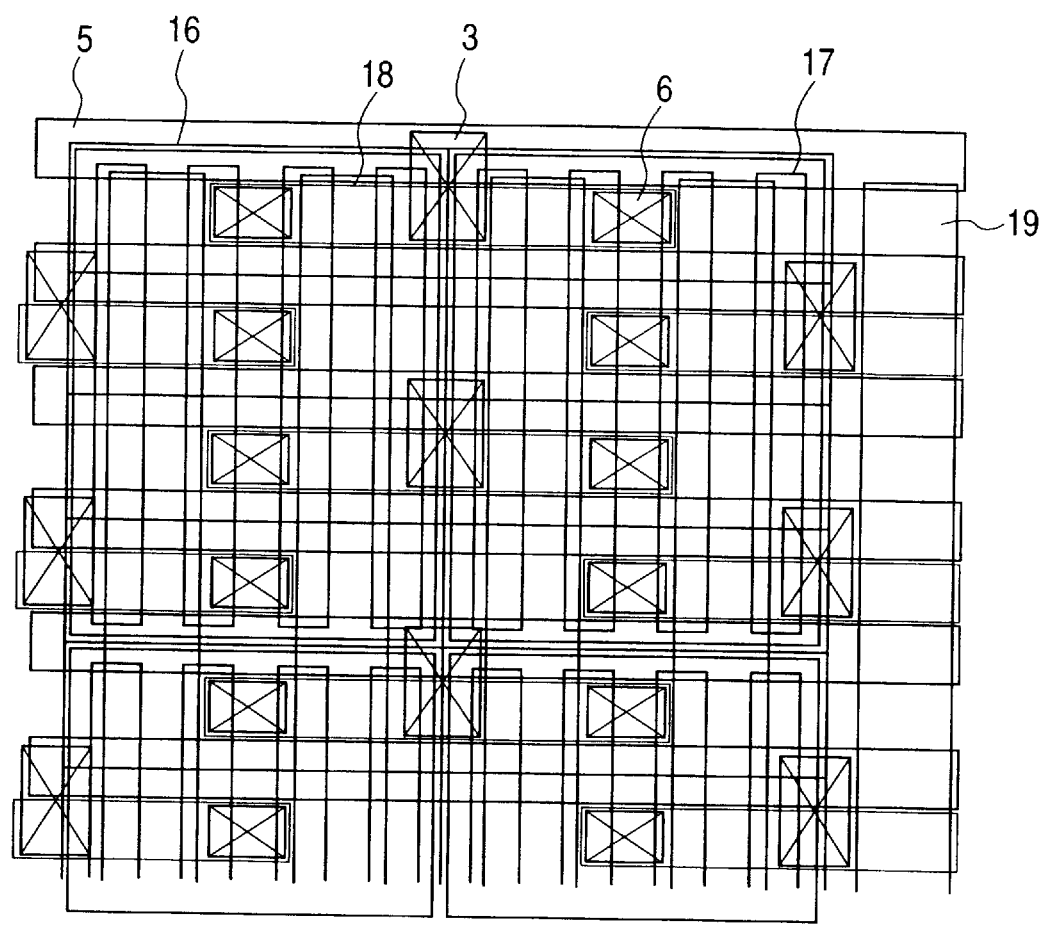
FIG. 44 is a diagram showing another layout of memory cells employed in a semiconductor device provided by the present invention.
Figure 45:
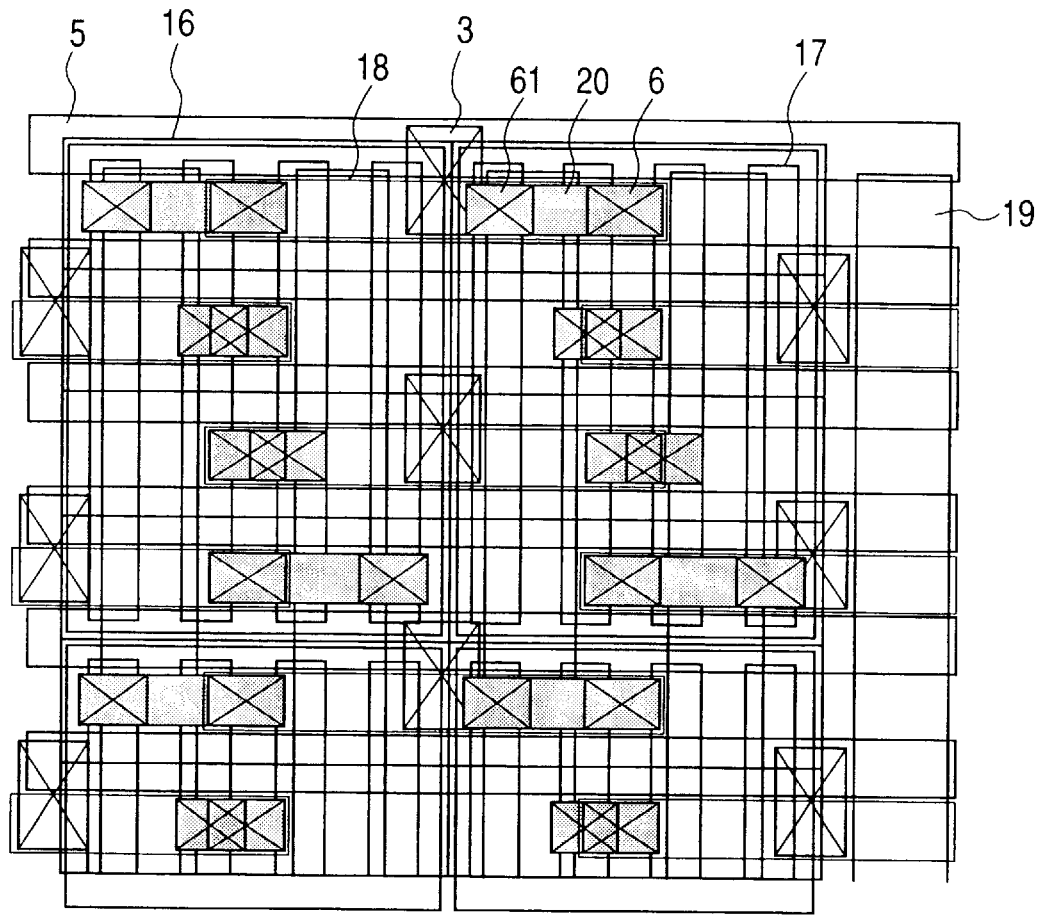
FIG. 45 is a diagram showing another layout of storage-node contacts of memory cells employed in a semiconductor device provided by the present invention.

FIG. 44 is a diagram showing a layout of the memory cells and the capacitors. FIG. 45 is a diagram showing a top view of a typical method of pulling out a storage node.

In FIGS. 44 and 45, reference numerals 19 and 5 denote a word line and a bit line, respectively. Reference numeral 3 denotes a bit-line contact and reference numeral 4 denotes a storage contact. Reference numerals 6 and 61 denote a storage-node contact and an extended storage-node contact, respectively. Reference numeral 18 denotes an active area and reference numeral 16 denotes an area of one cell. Reference numeral 17 denotes a lower electrode and reference numeral 20 denotes a conductor for connecting the storage-node contact 6 to the extended storage-node contact 61. As shown in FIG. 44, memory cells are repeated in units of four memory cells. FIG. 44 thus shows an embodiment wherein four capacitors are created so as to be stretched over four memory-cell areas 16-1 to 16-4 which are laid out contiguously in the direction of the word line as has been conceptually explained previously.

Figure 46:
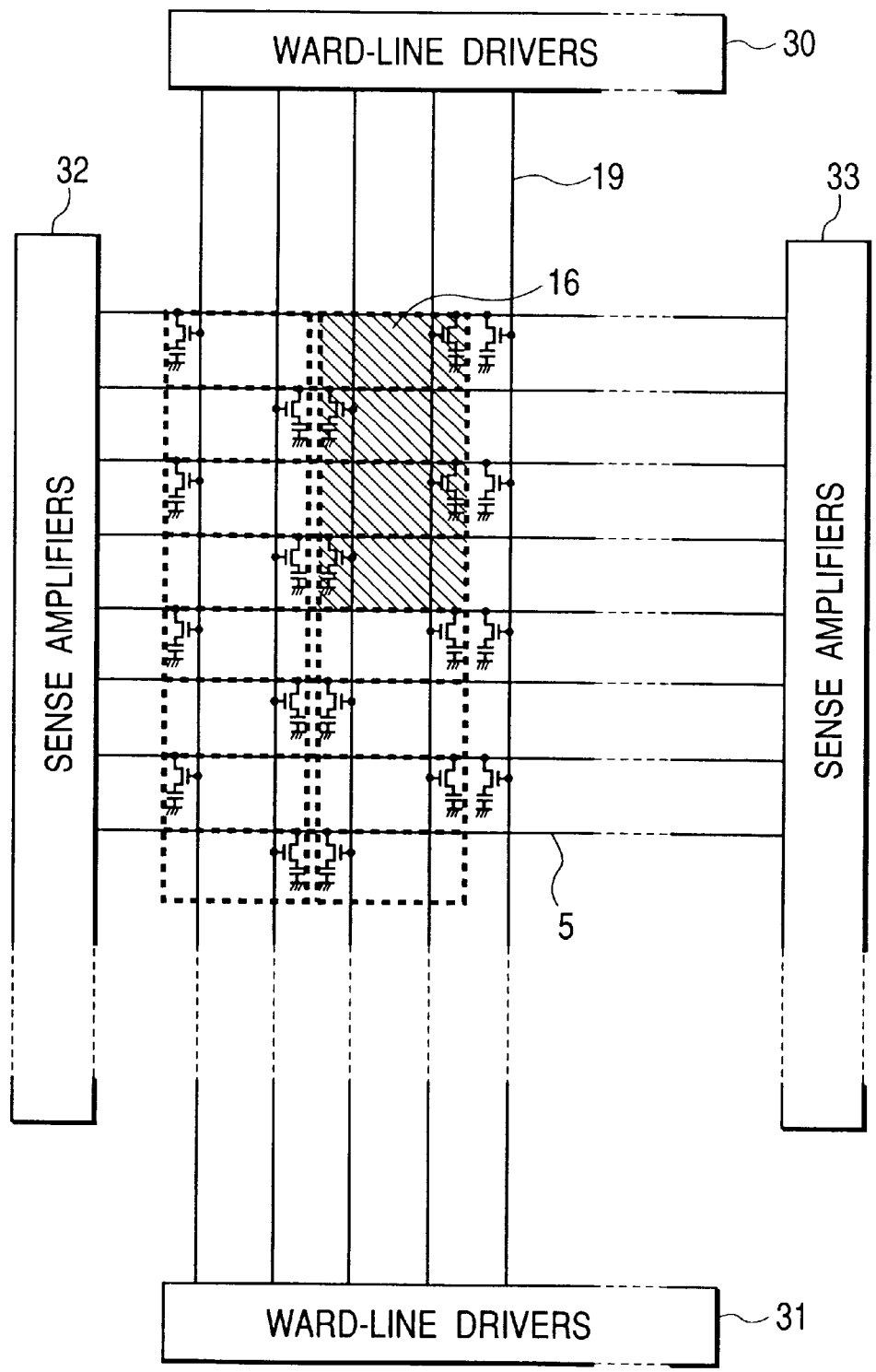
FIG. 46 is a circuit diagram of a further typical memory mat provided by the present invention.

FIG. 46 is a circuit diagram showing the embodiment. The shaded rectangular portion represents a unit. In this example, a unit comprises four cells. Except for the change in one-unit configuration, the other basic structures are the same as those shown in FIG. 36.

Figure 1:
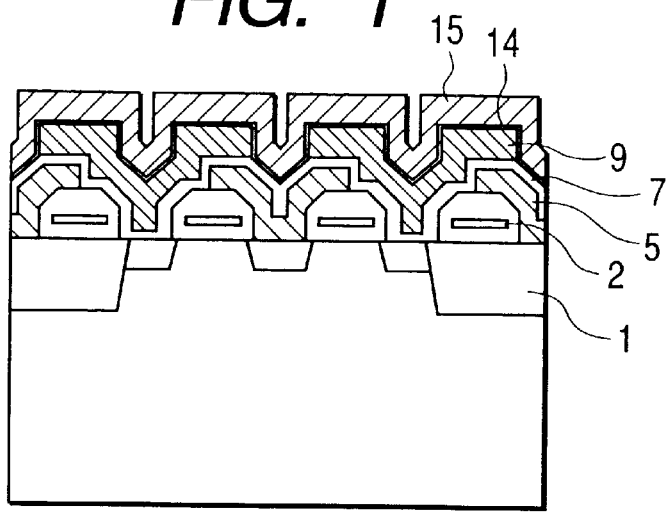
FIG. 1 is a diagram showing a cross section of a capacitor of a conventional semiconductor device.
Figure 2:
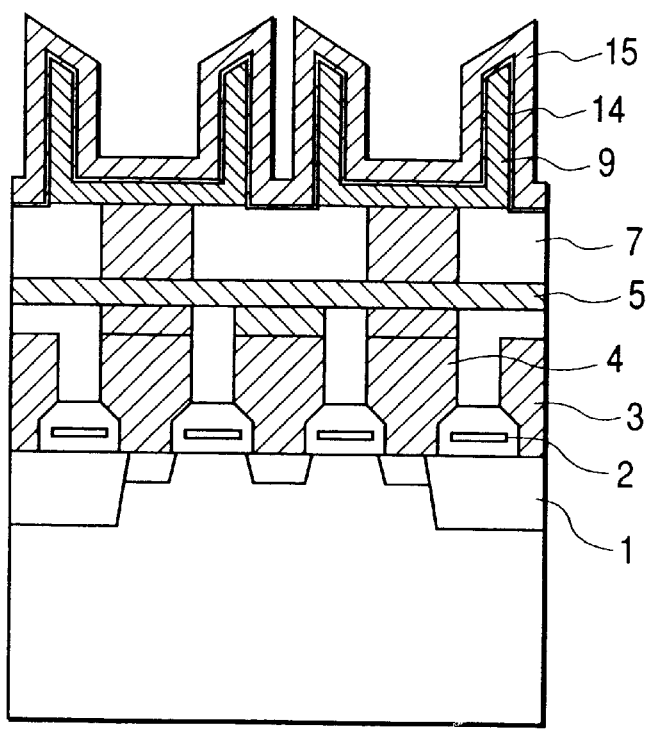
FIG. 2 is a diagram showing a cross section of a capacitor of another conventional semiconductor device.
Figure 3:
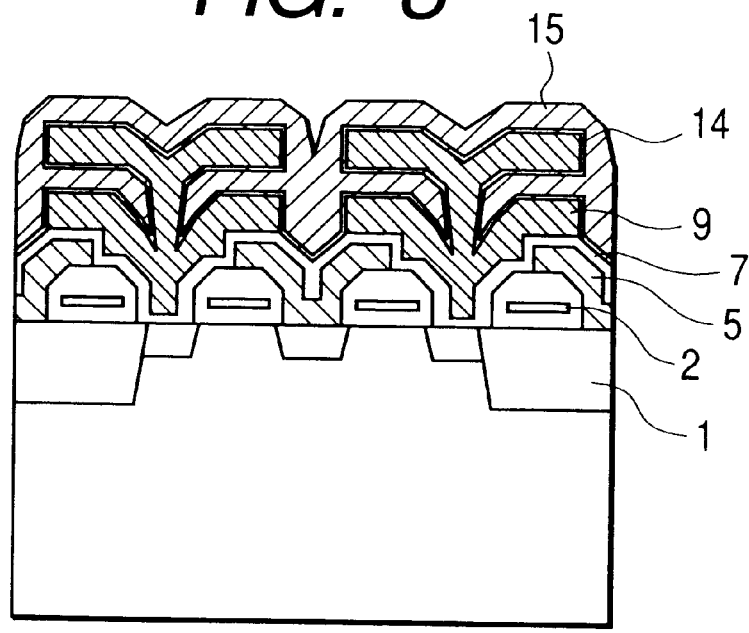
FIG. 3 is a diagram showing a cross section of a capacitor of a further conventional semiconductor device.
Figure 4:
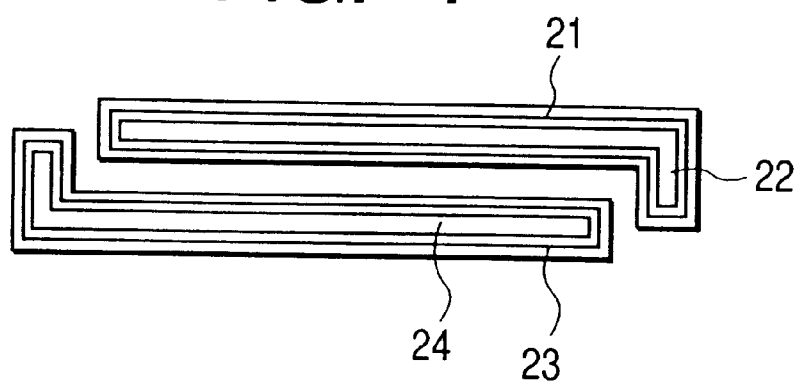
FIG. 4 is a diagram showing a top view of an electrode of a capacitor of a conventional semiconductor device.

In this embodiment, it is possible to obtain a capacitor with a capacitance 1.3 times that of a crown capacitor created in one cell with the same height as the structure shown in FIG. 37 or 1.8 times that of the capacitor in the structure shown in FIG. 41.

When a capacitor is created so as to be stretched over a plurality of cells as is the case with the above-described embodiments, the capacitor exists on a plurality of bit lines so that it is quite within the bounds of possibility that the bit-line capacitance increases. In such a case, it is desirable to use an antiferroelectric film as an insulation layer between the bit lines and the capacitor or to adopt a technique such as air isolation. In addition, when a capacitor is created so as to be stretched over a plurality of cells, a unit comprising $2^n$ (the nth power of 2) cells is convenient for the design of the device.

In the detailed description of the present invention, a MOS transistor has been employed as a switching device electrically connected to a capacitor cell. It should be noted that implementations of the switching device are not limited to a field-effect transistor including a stacked-layer structure comprising a metal, an oxide insulation film and a semiconductor. Any other implementation can be used as a switching device as long as the implementation does not deviate from the gist of the present invention. For example, as a switching device, it is also possible to use a field-effect transistor wherein an insulation film other than an oxide film is used as a gate insulation film or a gate electrode thereof is made of doped poly-crystalline silicon.

In the explanation of an insulator or a conductive material in the detailed description of the invention in this specification, the technical term 'chemical formula' is used.

The explanation does not limit the composition of the material to the stoichiometry of the chemical formula. That is, any material with a different chemical composition and any material including an impurity can be selected as a composition material as long as the material is within a range that does not bring about a change in material characteristic deviating from the -gist of the material specified by the chemical formula. For example, as an insulation film including $Si_3N_4$ in the description thereof, a P-SIN (Plasma Silicon Nitride) film can be used whereas, as an insulation film including $SiO_2$ in the description thereof, a BPSG (Boron Phosphorus Silicon-oxide Glass) film, a P-TEOS (Plasma-tetraethoxysilane) film or a SOG (Spin On Glass) film can also be used.

The present invention thus provides a capacitor having a high capacitance for a memory while assuring a higher-density integration.

More specifically, according to the present invention, by creating a capacitor of cubic structure by adopting "the self-matching technique, a capacitor with a capacitance 1.7 times that of a crown STC capacitor with a design rule of typically 0.5 microns and with an equal height can be obtained. In addition, by creating a capacitor which stretches over a plurality of cells in order to effectively utilize spaces between any adjacent cells, it is possible to realize an increase in capacity by typically 1.4 to 2.3 times, Moreover, the present invention results in an effect wherein the greater the height of a capacitor, the greater will be the rate of increase in capacitance.

What is claimed is:

1. A semiconductor device comprising capacitor cells, bit lines, word lines and MOS transistors in a memory cell area over a semiconductor substrate wherein;

gates of said MOS transistors are comprised of said word lines;

said capacitor cell is electrically connected to either a source area or a drain area of said MOS transistor;

said capacitor cell comprises a first electrode and a second electrode formed over said first electrode;

said first and second electrodes are separated by a dielectric layer;

said first electrode comprises a bottom body and a plurality of wall-shaped bodies, each one of said plurality of wall-shaped bodies having a bottom end electrically connected to said bottom body and a top end which does not physically connect to the top end of an adjacent wall-shaped body;

said bottom bodies of each capacitor cell are formed on a first insulator over said MOS transistors;

insulator strips are formed between said adjacent bottom bodies on said first insulator;

said bottom body is surrounded by said insulator strip;

said adjacent bottom bodies are electrically separated by said insulator strip, wherein;

the top surface of said bottom bodies and the top surface of said insulator strips are at the same level;

said wall-shaped bodies parallel to each other are arranged in a direction parallel to an arrangement of said word line.

2. A semiconductor device according to claim 1, the number of said wall-shaped bodies in said capacitor cell in a plan view is not less than four.

3. A semiconductordevice according to claim 1, wherein a distance of said adjacent bottom bodies is longer than a width of said wall-shaped body, and shorter than the sum of a width of said wall-shaped body and a distance of said adjacent wall-shaped bodies.

4. A semiconductor device comprising capacitor cells, bit lines, word lines and MOS transistors in a memory cell area over a semiconductor substrate wherein:

gates of said MOS transistors are comprised of said word lines;

said capacitor cell is electrically connected to either a source area or a drain area of said MOS transistors;

said capacitor cell comprises a first electrode and a second electrode formed over said first electrode;

said first and second electrodes are separated by a dielectric layer;

said first electrode comprises a bottom body and a plurality of wall-shaped bodies, each of said plurality of wall-shaped bodies having a bottom end electrically connected to said bottom body and a top end which does not physically connect to a top end of an adjacent wall-shaped body;

said bottom bodies of each capacitor cell are formed on a first insulator over said MOS transistors;

insulator strips are formed between said adjacent bottom bodies on said first insulator; wherein
the top surface of said bottom bodies and the top surface of said insulator strips are at a same level;
said wall-shaped bodies parallel to each other are arranged in a direction parallel to an arrangement of said word line.

5. A semiconductor device comprising capacitor cells, bit lines, word lines and MOS transistors in a memory cell area over a semiconductor substrate wherein;

gates of said MOS transistors are comprised of said word lines;

said capacitor cell is electrically connected to either a source area or a drain area of said MOS transistor;

said capacitor cell comprises a first electrode and a second electrode formed over said first electrode;

said first and second electrodes are separated by a dielectric layer;

said first electrode comprises a bottom body and a plurality of wall-shaped bodies, each of said plurality of wall-shaped bodies having a bottom end electrically connected to said bottom body and a top end which does not physically connect to a top end of an adjacent wall-shaped body;

said bottom bodies of each capacitor cell are formed on a first insulator over said MOS transistors;

insulator strips are formed between said adjacent bottom bodies on said first insulator; and said dielectric layer and second electrode are formed over said bottom body and insulator strip; wherein
the top surface of said bottom bodies and the top surface of said insulator strips are at a same level;
said wall-shaped bodies parallel to each other are arranged in a direction parallel to an arrangement of said word line.

6. A semiconductor device according to claim 5, wherein said second electrode is formed on said dielectric layer.

* * * * *